(12) United States Patent
Shachal

(10) Patent No.: US 8,164,057 B2
(45) Date of Patent: Apr. 24, 2012

(54) INTERFACE, A METHOD FOR OBSERVING AN OBJECT WITHIN A NON-VACUUM ENVIRONMENT AND A SCANNING ELECTRON MICROSCOPE

(76) Inventor: Dov Shachal, Rehovot (IL)

( * ) Notice: Subject to any disclaimer, the term of this patent is extended or adjusted under 35 U.S.C. 154(b) by 120 days.

(21) Appl. No.: 12/446,757

(22) PCT Filed: Oct. 23, 2007

(86) PCT No.: PCT/IL2007/001265
§ 371 (c)(1),
(2), (4) Date: Jan. 24, 2010

(87) PCT Pub. No.: WO2008/050321
PCT Pub. Date: May 2, 2008

(65) Prior Publication Data
US 2010/0140470 A1      Jun. 10, 2010

Related U.S. Application Data

(60) Provisional application No. 60/862,631, filed on Oct. 24, 2006.

(51) Int. Cl.
*G01N 23/00* (2006.01)
(52) U.S. Cl. ......... 250/307; 250/306; 250/311; 250/310
(58) Field of Classification Search .................. 250/311, 250/306, 307
See application file for complete search history.

(56) References Cited

U.S. PATENT DOCUMENTS

| | | | | |
|---|---|---|---|---|
| 4,058,724 A | * | 11/1977 | McKinney et al. | 850/9 |
| 4,992,662 A | * | 2/1991 | Danilatos | 850/9 |
| 6,156,435 A | * | 12/2000 | Gleason et al. | 428/422 |
| 6,188,074 B1 | * | 2/2001 | Satoh et al. | 250/492.22 |
| 6,452,177 B1 | * | 9/2002 | Feldman et al. | 850/9 |
| 6,992,300 B2 | * | 1/2006 | Moses et al. | 250/440.11 |
| 2003/0077530 A1 | * | 4/2003 | Fujiwara et al. | 430/30 |
| 2003/0132382 A1 | * | 7/2003 | Sogard | 250/311 |
| 2003/0168595 A1 | * | 9/2003 | Danilatos | 250/310 |
| 2005/0092935 A1 | * | 5/2005 | Demos et al. | 250/492.2 |
| 2005/0173632 A1 | * | 8/2005 | Behar et al. | 250/311 |
| 2006/0033038 A1 | * | 2/2006 | Moses et al. | 250/440.11 |
| 2006/0169910 A1 | * | 8/2006 | Frosien et al. | 250/396 ML |
| 2006/0284108 A1 | * | 12/2006 | Buijsse et al. | 250/441.11 |
| 2007/0194225 A1 | * | 8/2007 | Zorn | 250/306 |

\* cited by examiner

*Primary Examiner* — Jack Berman
*Assistant Examiner* — Jason McCormack
(74) *Attorney, Agent, or Firm* — Stein McEwen, LLP

(57) ABSTRACT

An interface, a scanning electron microscope and a method for observing an object that is positioned in a non-vacuum environment. The method includes: passing at least one electron beam that is generated in a vacuum environment through at least one aperture out of an aperture array and through at least one ultra thin membrane that seals the at least one aperture; wherein the at least one electron beam is directed towards the object; wherein the at least one ultra thin membrane withstands a pressure difference between the vacuum environment and the non-vacuum environment; and detecting particles generated in response to an interaction between the at least one electron beam and the object.

69 Claims, 17 Drawing Sheets

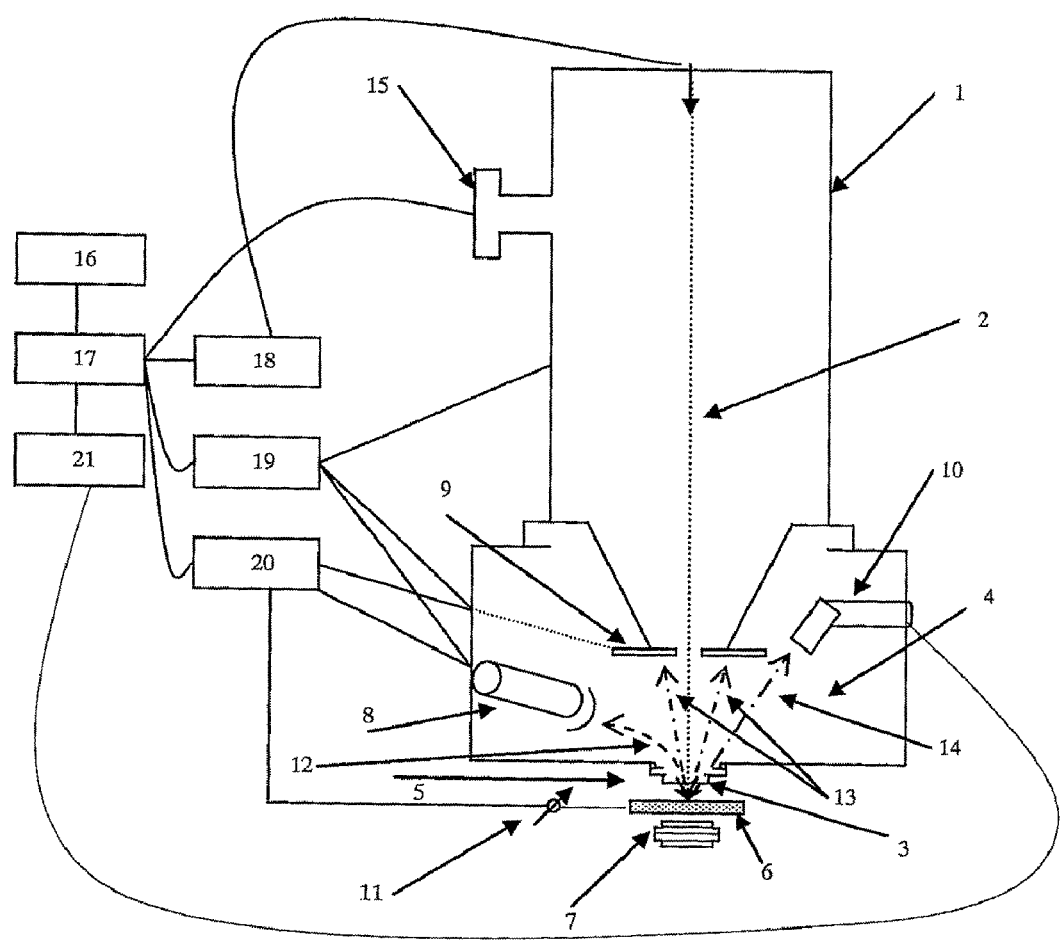
30   Figure 1

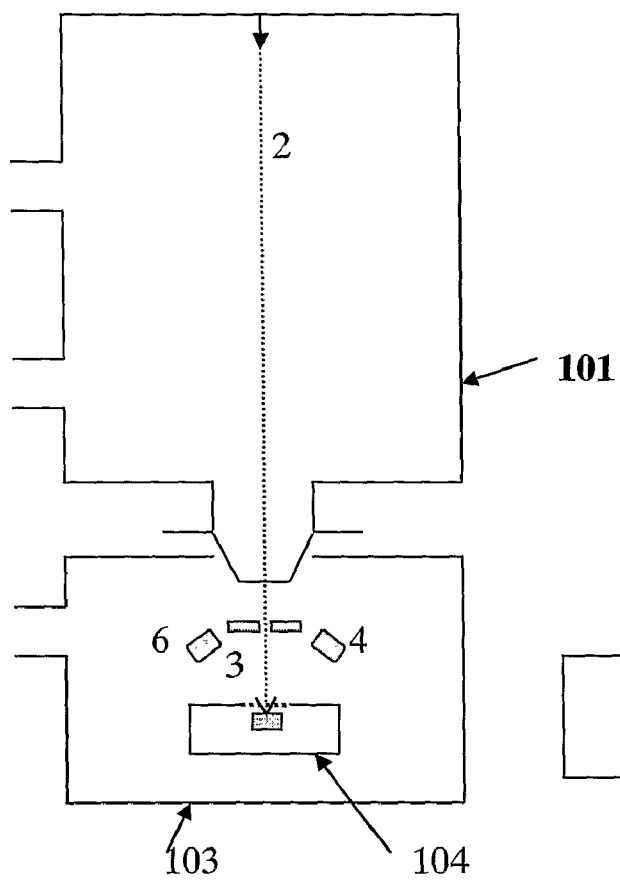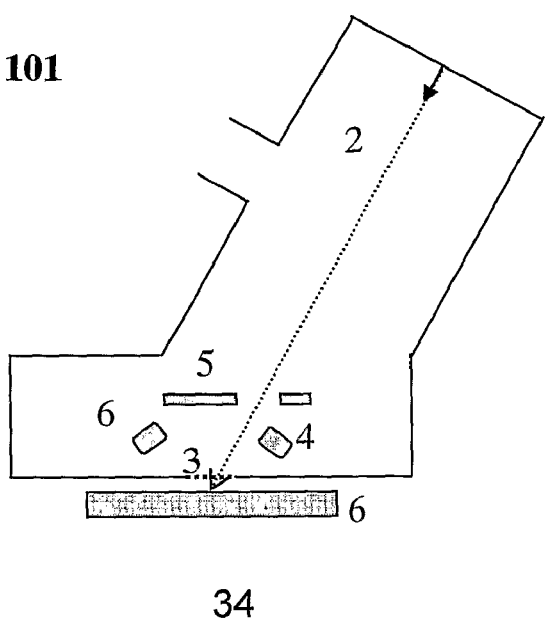
33
Figure 3a
34
Figure 3b

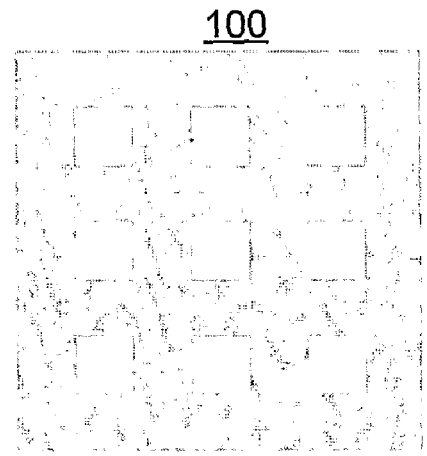
| 2 | 1 | 2 | 1 | 2 | 1 |
|---|---|---|---|---|---|
| 4 | 3 | 4 | 3 | 4 | 3 |
| 2 | 1 | 2 | 1 | 2 | 1 |
| 4 | 3 | 4 | 3 | 4 | 3 |
| 2 | 1 | 2 | 1 | 2 | 1 |
| 4 | 3 | 4 | 3 | 4 | 3 |
Figure 6a
Figure 6b
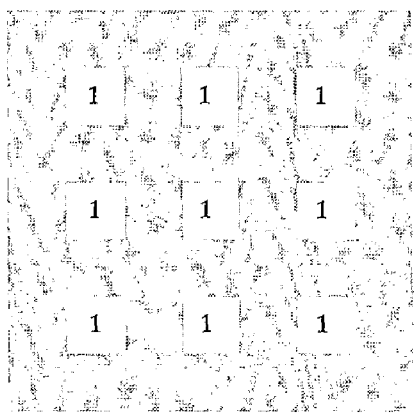
Figure 6c
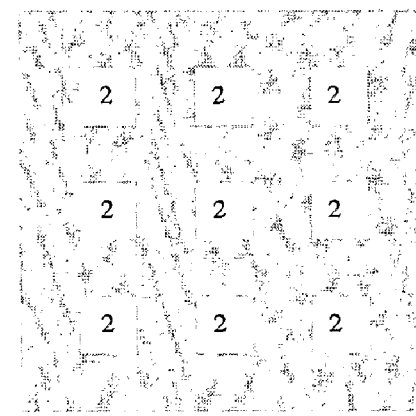
Figure 6d
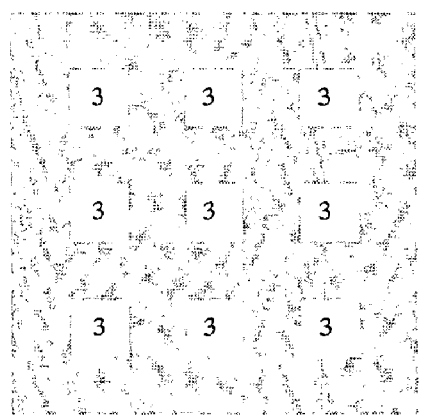
Figure 6e
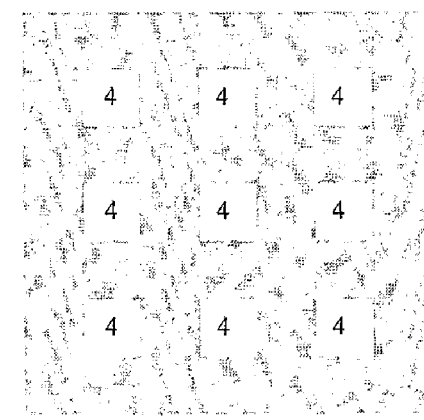
Figure 6f 11 microns 3 microns

INTERFACE, A METHOD FOR OBSERVING AN OBJECT WITHIN A NON-VACUUM ENVIRONMENT AND A SCANNING ELECTRON MICROSCOPE

CROSS-REFERENCE TO RELATED APPLICATIONS

This application is a National Phase Application of PCT International Application No. PCT/IL2007/001265, entitled "AN INTERFACE, A METHOD FOR OBSERVING AN OBJECT WITHIN A NON-VACUUM ENVIRONMENT AND A SCANNING ELECTRON MICROSCOPE", International Filing Date Oct. 23, 2007, published on May 2, 2008 as International Publication No. WO 2008/050321, which in turn claims priority from U.S. Provisional Patent Ser. No. 60/862,631, filed Oct. 24, 2006, both of which are incorporated herein by reference in their entirety.

BACKGROUND OF THE INVENTION

High resolution microscopy is used in research and development, quality assurance and production in diverse fields such as material science, life science, the semiconductor industry and the food industry.

Optical microscopy dating back to the seventeenth century, has reached its brick wall, defined by the wavelength of deep Ultra Violet photons, giving a finest resolution of about 80 nm. The popularity of optical microscopy stems from its relative low price, ease of use and the variety of imaging environment all translated to availability.

Scanning electron microscopy provides a much finer resolution (even few nanometers) but in order to achieve that high resolution the inspected object should be placed in a vacuum environment.

U.S. Pat. No. 6,992,300 of Moses titled "Device and method for the examination of samples in a non-vacuum environment using a scanning electron microscope" describes a chamber that includes an ultra thin member that can withstand a vacuum and is transparent to electrons. The thickness of the membrane is arguably few hundred Angstrom.

Due to mechanical constraints, using an ultra thin membrane implies small supporting aperture. The small size of the ultra thin membrane dramatically reduces the throughput of the scanning electron microscope and renders such a scanning electron microscope impractical.

There is a growing need to provide fast and accurate scanning electron microscopes.

SUMMARY OF THE INVENTION

A method for observing an object that is positioned in a non-vacuum environment, the method includes: passing at least one electron beam that is generated in a vacuum environment through at least one aperture out of an aperture array and through at least one ultra thin membrane that seals the at least one aperture; wherein the at least one electron beam is directed towards the object; wherein the at least one ultra thin membrane withstands a pressure difference between the vacuum environment and the non-vacuum environment; and detecting particles generated in response to an interaction between the at least one electron beam and the object.

Conveniently, the passing includes passing at least one electron beam through multiple apertures of the aperture array.

Conveniently, the passing is preceded by selecting an aperture of the aperture array and wherein the passing includes passing an electron beam through the selected aperture.

Conveniently, the method includes passing at least one electron beam through at least one aperture of the aperture array wherein apertures of the aperture array are positioned at a single horizontal plain.

Conveniently, the method includes passing at least one electron beam through at least one aperture of the aperture array; and wherein at least one aperture of the aperture array is positioned at a different height than at least one other aperture of the aperture array.

Conveniently, the method includes passing at least one electron beam through at least one aperture of the aperture array; and wherein at least one aperture of the aperture array enables an acquisition of a higher resolution image than at least one other aperture of the aperture array.

Conveniently, the method includes performing a first iteration of passing and detecting and a second iteration of passing and detecting; wherein the first phase includes passing at least one electron beam through at least one aperture to provide a first resolution image of at least a portion of the object, and the second phase includes passing at least one electron beam through at least one other aperture to provide a second resolution image of at least a portion of the object.

Conveniently, the passing is preceded by locating a region of interest of the object using a low resolution imaging process; and the passing includes passing at least one electron beam directed towards the region of interest.

Conveniently, the passing and detecting are characterized by a first resolution range and wherein the method further includes utilizing another observation process that is characterized by a different resolution range.

Conveniently, the other observation process includes atomic force microscopy.

Conveniently, the other observation process includes an optical inspection process.

Conveniently, the method further includes scanning at least one area of the object by deflecting the at least one electron beam and introducing a corresponding mechanical movement of the at least one aperture through which the at least one electron beam pass.

Conveniently, the method includes scanning at least one area of the object by deflecting the at least one electron beam and introducing a corresponding mechanical movement of the aperture array.

Conveniently, the method includes scanning at least one area of the object by deflecting the at least one electron beam and introducing a corresponding mechanical movement of the aperture array; wherein a component that includes is flexibly coupled to another component of an interface that separates the vacuum environment from the non-vacuum environment.

Conveniently, the method includes scanning multiple areas of the object by deflecting the at least one electron beam that pass through multiple apertures of the aperture array.

Conveniently, the method includes scanning multiple areas of the object by deflecting the at least one electron beam that pass through multiple apertures of the aperture array and introducing a corresponding mechanical movement of the aperture array.

Conveniently, the method includes scanning an area of the object by deflecting the at least one electron beam by a deflector positioned within the vacuum environment.

Conveniently, the method includes detecting electrons generated in response to the interaction between the at least one electron beam and the object.

Conveniently, the method includes detecting photons generated in response to the interaction between the at least one electron beam and the object.

Conveniently, the method includes detecting X-ray emission generated in response to the interaction between the at least one electron beam and the object.

Conveniently, the method includes detecting particles by a detector positioned within the vacuum environment.

Conveniently, the method includes detecting particles by a detector positioned within the non-vacuum environment.

Conveniently, an optical axis of the at least one electron beam is non-perpendicular to the object.

Conveniently, the method includes detecting electron current generated as a result of the interaction.

Conveniently, the method includes detecting Cathodoluminescence of the object, fluorescence markers or light emitted due to electron excitation of gas molecules.

Conveniently, the method includes introducing a gas mixture into the non-vacuum environment such as to improve the detecting.

Conveniently, the method includes introducing nitrogen into the non-vacuum environment.

Conveniently, the method includes introducing He enriched mixture into the non-vacuum environment.

Conveniently, the method includes aligning the at least one electron beam with at least one aperture.

Conveniently, the method includes aligning the at least one electron beam with at least one aperture by introducing a mechanical moving the at least one aperture.

Conveniently, the method includes repetitively altering a distance between an aperture and the object and measuring electrons emitted from the object to provide measurements results and comparing the measurement results to a calibration curve that is responsive to a mean free path of electrons in the non-vacuum environment.

Conveniently, the method includes determining a distance between an aperture and the object based upon an expected mean free path of electrons in the non-vacuum environment.

Conveniently, the method includes determining a distance between an aperture and the object based upon counts of emitted X-ray photons of gas within the non-vacuum environment that is situated between the object and the aperture.

A method for observing an object that is positioned in a non-vacuum environment, the method includes: scanning at least one area of the object by: deflecting at least one electron beam generated in a vacuum environment and allowing the at least one electron beam to pass through at least one aperture sealed by an ultra thin membrane; wherein the at least one ultra thin membrane withstands a pressure difference between the vacuum environment and the non-vacuum environment; and introducing a corresponding mechanical movement of the at least one aperture; and detecting particles generated in response to an interaction between the at least one electron beam and the at least one area of the object.

An interface between a vacuum environment and a non-vacuum environment, the interface includes an aperture array sealed by at least one ultra thin membrane that is substantially transparent to electrons and withstands a pressure difference between the vacuum environment and the non-vacuum environment.

Conveniently, apertures of the aperture array are positioned at a single horizontal plain.

Conveniently, at least one aperture of the aperture array is positioned at a different height than at least one other aperture of the aperture array.

Conveniently, at least one aperture of the aperture array enables an acquisition of a higher resolution image than at least one other aperture of the aperture array.

A scanning electron microscope includes: an electron beam source positioned in a vacuum environment; the electron beam source is adapted to generate at least one electron beam; an interface between the vacuum environment and a non-vacuum environment in which an object is positioned, the interface includes an aperture array sealed by at least one ultra thin membrane that is substantially transparent to electrons and withstands a pressure difference between the vacuum environment and the non-vacuum environment; electron optics adapted to direct the at least one electron beam through at least one aperture and towards an object located in the non-vacuum environment; and a detector that detects particles generated in response to an interaction between the at least one electron beam and the object.

Conveniently, the electron optics directs at least one electron beam towards multiple apertures of the aperture array.

Conveniently, the scanning electron microscope is adapted to select an aperture of the aperture array and wherein then direct an electron beam through the selected aperture.

Conveniently, apertures of the aperture array are positioned at a single horizontal plain.

Conveniently, at least one aperture of the aperture array is positioned at a different height than at least one other aperture of the aperture array.

Conveniently, at least one aperture of the aperture array enables an acquisition of a higher resolution image than at least one other aperture of the aperture array.

Conveniently, the scanning electron microscope is adapted to direct at least one electron beam through at least one aperture to provide a first resolution image of at least a portion of the object, and then direct at least one electron beam through at least one other aperture to provide a second resolution image of at least a portion of the object.

Conveniently, the scanning electron microscope is adapted to locate a region of interest of the object using a low resolution imaging process and then direct at least one electron beam towards the region of interest.

Conveniently, the scanning electron microscope another observation tool that is characterized by another resolution that the resolution provided by the electron beam.

Conveniently, the other observation tool is an atomic force microscope.

Conveniently, the other observation tool is an optical inspection tool.

Conveniently, the scanning electron microscope is adapted to scan at least one area of the object by deflecting the at least one electron beam and introducing a corresponding mechanical movement of the at least one aperture through which the at least one electron beam pass.

Conveniently, the scanning electron microscope is adapted to scan at least one area of the object by deflecting the at least one electron beam and introduce a corresponding mechanical movement of the aperture array.

Conveniently, the scanning electron microscope is adapted to scan at least one area of the object by deflecting the at least one electron beam and introduce a corresponding mechanical movement of the aperture array; wherein a component that includes the aperture array is flexibly coupled to another component of an interface that separates the vacuum environment from the non-vacuum environment.

Conveniently, the scanning electron microscope is adapted to scan multiple areas of the object by deflecting the at least one electron beam that pass through multiple apertures of the aperture array.

Conveniently, the scanning electron microscope is adapted to scan multiple areas of the object by deflecting the at least one electron beam that pass through multiple apertures of the aperture array and introducing a corresponding mechanical movement of the aperture array.

Conveniently, the scanning electron microscope includes a deflector that is positioned within the vacuum environment that deflects the at least one electron beam such as to scan an area of the object.

Conveniently, the detector detects electrons generated in response to the interaction between the at least one electron beam and the object.

Conveniently, the detector detects photons generated in response to the interaction between the at least one electron beam and the object.

Conveniently, the detector detects X-ray emission generated in response to the interaction between the at least one electron beam and the object.

Conveniently, the detector is positioned within the vacuum environment.

Conveniently, the detector is positioned within the non-vacuum environment.

Conveniently, an optical axis of the at least one electron beam is non-perpendicular to the object.

Conveniently, the detector detects electron current generated as a result of the interaction.

Conveniently, the detector detects Cathodoluminescence of the object, fluorescence markers or light emitted due to electron excitation of gas molecules.

Conveniently, the scanning electron microscope is adapted to introduce a gas mixture into the non-vacuum environment such as to improve the detecting.

Conveniently, the scanning electron microscope is adapted to introduce nitrogen into the non-vacuum environment.

Conveniently, the scanning electron microscope is adapted to introduce He enriched mixture into the non-vacuum environment.

Conveniently, the scanning electron microscope is adapted to align the at least one electron beam with at least one aperture.

Conveniently, the scanning electron microscope is adapted to align the at least one electron beam with at least one aperture by introducing a mechanical movement the at least one aperture.

Conveniently, the scanning electron microscope is adapted to repetitively alter a distance between an aperture and the object, measure electrons emitted from the object to provide measurements results and compare the measurement results to a calibration curve that is responsive to a mean free path of electrons in the non-vacuum environment.

Conveniently, the scanning electron microscope is adapted to determine a distance between an aperture and the object based upon an expected mean free path of electrons in the non-vacuum environment.

Conveniently, the scanning electron microscope is adapted to determine a distance between an aperture and the object based upon counts of emitted X-ray photons of gas within the non-vacuum environment that is situated between the object and the aperture.

An interface between a vacuum environment and a non-vacuum environment, the interface includes at least one aperture sealed by at least one ultra thin membrane that is substantially transparent to electrons and withstands a pressure difference between the vacuum environment and the non-vacuum environment; wherein a component that includes the at least one aperture is flexibly coupled to another component of the interface.

Conveniently, the aperture includes an aperture array and wherein apertures of the aperture array are positioned at a single horizontal plain.

Conveniently, the aperture includes an aperture array and wherein at least one aperture of the aperture array is positioned at a different height than at least one other aperture of the aperture array.

Conveniently, the aperture includes an aperture array and wherein at least one aperture of the aperture array enables an acquisition of a higher resolution image than at least one other aperture of the aperture array.

A scanning electron microscope includes: an electron beam source positioned in a vacuum environment; the electron beam source is adapted to generate at least one electron beam; an interface between a vacuum environment and a non-vacuum environment, the interface includes at least one aperture sealed by at least one ultra thin membrane that is substantially transparent to electrons and withstands a pressure difference between the vacuum environment and the non-vacuum environment; wherein a component that includes the at least one aperture is flexibly coupled to another component of the interface; electron optics adapted to direct the at least one electron beam through at least one aperture and towards an object located in the non-vacuum environment; and a detector that detects particles generated in response to an interaction between the at least one electron beam and the object.

BRIEF DESCRIPTION OF THE DRAWINGS

FIG. 1 illustrates a system according to an embodiment of the invention;

FIGS. 3a and 3b illustrate systems according to two embodiments of the invention;

FIGS. 6a-6f illustrates an area of an object and multiple images that image the entire area according to an embodiment of the invention;

FIGS. 18a-18c are images of an aperture and of a grid imaged in air according to an embodiment of the invention.

DETAILED DESCRIPTION OF THE INVENTION

Figure 2A:
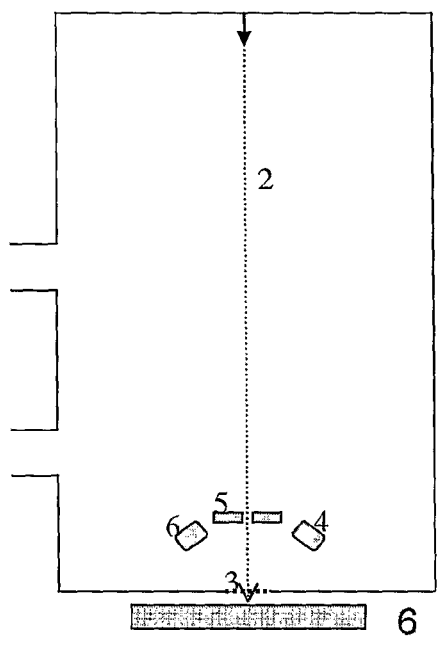
FIGS. 2a and 2b illustrate systems according to two embodiments of the invention.

According to an embodiment of the invention the throughput of a scanning electron microscope that observes an object (positioned in a non-vacuum environment) is increased by illuminating multiple apertures (sealed by one or more membranes) simultaneously. These multiple apertures can form an aperture array or can be a part of an aperture array.

According to an embodiment of the invention one or more areas of an inspected object (positioned in a non-vacuum environment) are scanned by deflecting one or more electron beams and also introducing a corresponding mechanical movement of one or more apertures through which the one or more electron beams pass. This combination of deflection and mechanical movement increases the field of view of the system.

According to yet another embodiment of the invention multiple apertures that are sealed by one or more membranes are provided. The apertures and the membranes can differ by their size and thickness (of membranes) thus providing different compromises between field of views and resolution.

The term aperture array means any arrangement (ordered or non-ordered) of apertures.

Conveniently, the ultra thin membrane is thinner then few tens of nanometers and is made of low density material such as Carbon or SiN.

When multiple apertures are provided each aperture can be sealed by its own membrane, although this is not necessarily so. A single membrane can seal multiple apertures. According to an embodiment of the invention the membrane can be connected to a very thin grid that defines multiple apertures.

The ultra thin membrane seals an aperture while withstanding the pressure difference between the vacuum environment and the non-vacuum environment.

The ultra thin membrane is used because it has the minimal impact on the electron spot size. For better performance it is advantageous to use higher electron accelerating voltages, preferably 20 kV and higher. Another advantage of using ultra thin membrane is that the electrons used to generate the image can be efficiently collected with detectors situated in the vacuum environment.

Electrons interact with the inspected object and various particles are formed. Particles such electrons or photons can be detected. Detection signals from one or more detectors can be processed in order to provide an image of the object.

According to an embodiment the system can provide different field of views. Different apertures and different membranes can be of different size and thickness. Different membranes can be located at different heights. Low resolution and low magnification can be provided by thicker membranes and larger apertures. High resolution can be provided by thinner membranes and smaller apertures. One or more apertures and membranes can be selected by either mechanically moving these one or more apertures towards the electron beam axis, and additionally or alternatively, using deflectors to deflect the electron beam to the desired aperture.

Conveniently, a large field of view can assist in navigation and finding a region of interest. The extended field of view can be obtained by utilizing multiple apertures that are separated from each other. Even if the multiple apertures do not provide a continuous image of an imaged area this can suffice for navigation or region of interest location.

According to various embodiments of the invention an object can be illuminated by multiple electron beams. It is noted that an electron beam can be spilt by the aperture array that is sealed with one or more membranes. It is further noted that multiple electron beams can be directed towards the aperture array. These multiple electron beams can be further split by the aperture array but this is not necessarily so as each electron beam can be directed toward a specific aperture.

For simplicity, some of the following explanations refer to a single electron beam. Those of skill in the art will appreciate that explanations that refer to a single electron beam can also be applied mutatis mutandis to multiple electron beams.

For simplicity, some of the following explanations refer to a single aperture (membrane). Those of skill in the art will appreciate that explanations that refer to a single aperture (membrane) beam can also be applied mutatis mutandis to multiple apertures (membranes).

FIG. 1 illustrates system 30 according to an embodiment of the invention.

System 30 (also referred to as SEM 30) includes: (i) scanning electron microscope column 1 that generates, accelerates, scans and focuses an electron beam 2; (ii) an interface 3 that includes one or more apertures that are sealed by one or more membranes; (iii) a sample holder (not shown) that is connected to optional mechanical stage 7; (iv) computer 16, (v) controller 17, (vi) high voltage supply 18, (vii) low power supply and scanner 19, (viii) data acquisition and image grabber 20, (ix) one or more pumps 15; and (x) one or more detectors such as but not limited to spectrometer controller and processor 21, side electron detector 8 (for detecting low energy electrons 12), center electron detector 9 (for detecting high energy electrons 13), a photon detector or spectrometer 10 (for detecting photons 14), a Pico ampere meter 11 (that measures a current generated as a response to an interaction between electron beam 2 and object 6). It is noted that only one of few of the mentioned above detectors can be included in system 30.

System 30 can generate an image of object 6, a two dimensional map of object 6, perform a point analysis or provide a spectrum. Computer 16 and controller 17 control the parameters and operation of various components of system 30.

Vacuum environment is denoted 4 while the non-vacuum environment is denoted 5.

Conveniently, electron beam 2 is directed towards object 6 such as to pass through one or more apertures of interface 3 and to impinge onto object 6. The impinging electrons generate secondary electrons, backscattered electrons, characteristic X-rays and in some cases Cathodoluminescence. The Cathodoluminescence can be either a surface property or due to light emission from markers or labeling molecules. The emitted signal is detected with the aid of one of the mentioned above detectors.

Figure 2B:
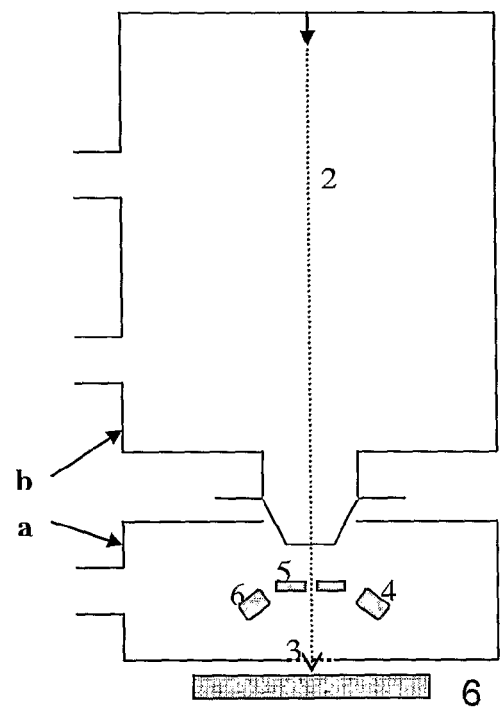

FIGS. 2a and 2b illustrate systems 31 and 32 according to two embodiments of the invention. FIG. 2a illustrates a single assembly that includes SEM column 1, detectors 4, 5 and 6 and interface 3.

FIG. 2b illustrates an adaptor chamber 102 that is connected to SEM 101. SEM 101 can work without adaptor chamber 102 and can be any available SEM in the market. Adaptor chamber 102 maintains a vacuum environment and includes detectors 4, 5 and 6, interface 3 and a SEM interface 103 that can be connected to SEM 101 and seal SEM 101 from the non-vacuum environment in which object 6 is located.

FIGS. 3a and 3b illustrate systems 33 and 34 according to two embodiments of the invention.

FIG. 3a illustrates an adaptor chamber 103 that is connected to SEM 101. SEM 101 can work without adaptor chamber 101 and can be any available SEM in the market.

Non-vacuum chamber 104 is located inside adaptor chamber 103 or is at least partially surrounded by adaptor chamber 103. Adaptor chamber 103 maintains a vacuum environment and includes detectors 4, 5 and 6, interface 3 and a SEM interface 103 that can be connected to SEM 101 and seal SEM 101 from non-vacuum chamber 104 in which object 6 is located.

FIG. 3b illustrates system 34 that includes a tilted SEM column 1' that illuminates object 6 in a titled (non-perpendicular manner). SEM column 1' can be stationary or can be rotated (optionally to a non-tilted position) in order to alter the angle between its optical axis and sample 6.

Aperture Array

Figure 8:
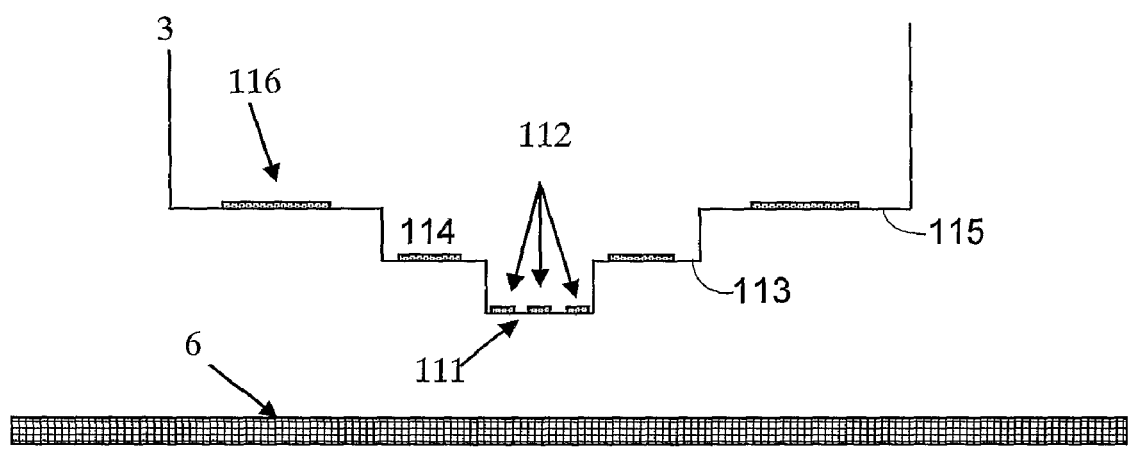
FIG. 8 illustrates multiple apertures and multiple membranes according to an embodiment of the invention.

The aperture array can include an aperture array of different sizes that are sealed by membranes of different areas and thickness. The different apertures can be positioned at the same plane, as illustrated in FIG. 4 but this is not necessarily so. For example, apertures and membranes can be positioned in a staggered manner, as illustrated in FIG. 8.

Figure 4A:
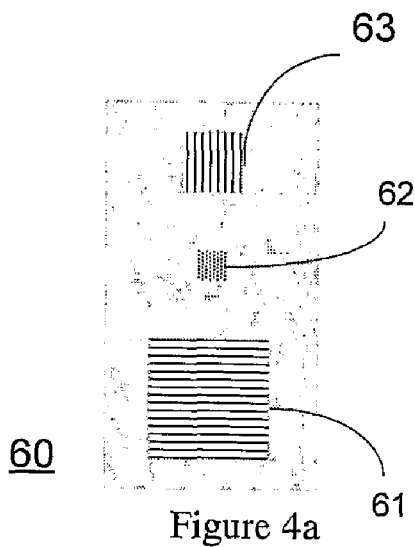
FIGS. 4a and 4b are a top view and a side view of an aperture array and multiple membranes according to an embodiment of the invention.
Figure 4B:
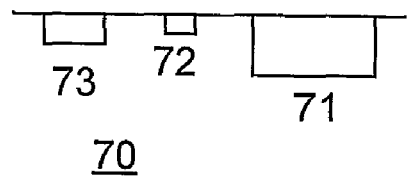

FIGS. 4a and 4b illustrate an aperture array 60 that includes three apertures 61, 62, and 63 and corresponding membranes 71, 72 and 73. FIG. 4a is a top view of aperture array 60 while FIG. 4a is a side view of aperture array 60. The biggest aperture is aperture 61 and its membrane (membrane 71) is the thickest. The smallest aperture is aperture 62 and its membrane (membrane 72) is the thinnest. The area of aperture 63 is smaller than the area of aperture 61 but bigger that the area of aperture 63. Accordingly, its corresponding membrane (membrane 73) is thinner than membrane 71 but thicker than membrane 72. The three apertures and membranes are positioned in the same plane. These apertures can be illuminated concurrently or separately.

Larger apertures should be sealed by thicker membranes. Larger apertures provide larger field of view but thicker membranes reduce the resolution. Accordingly, a system that includes membranes of different thickness and apertures of different areas can provide multiple trade-offs between field of views and resolution.

The different apertures can be accessed by moving the apertures to the electron beam position, and/or by deflecting the electron beam.

According to another embodiment of the invention an aperture array includes evenly sized apertures and conveniently evenly sized membranes.

Figure 5A:
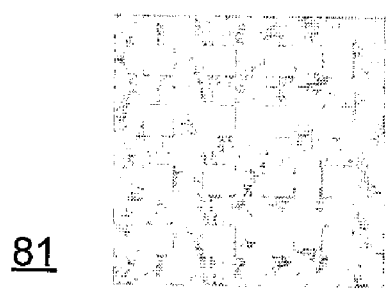
FIGS. 5a and 5b illustrate two aperture arrays according to various embodiments of the invention.
Figure 5B:
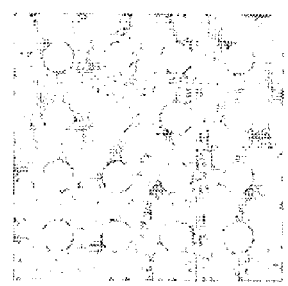

FIGS. 5a and 5b illustrate aperture arrays 81 and 82. Aperture array 81 includes rectangular apertures while aperture array 82 includes circular apertures. It is noted that a single aperture array can include apertures of different shaped apertures.

An entire area of the object can be imaged by scanning that area by an aperture array. The scanning axis can be parallel a longitudinal axis or a latitudinal axis of the aperture array but can also oriented in relation to these arrays. Referring to aperture array 81 of FIG. 4—the scan axis can be horizontal (parallel to a latitudinal axis of aperture array 81), can be vertical (parallel to a longitudinal axis of aperture array 81) or can be oriented to these axes.

It is noted that when virtually combining the field of view provided by each of the apertures a relatively large (though not continuous) field of view can be obtained. A non-continuous image of sub-areas of the object can be used during navigation stages.

FIGS. 6a-6f illustrates a rectangular area 80 of an object that is completely imaged by four different images that are shifted apart from each other. FIG. 6a illustrates rectangular area 80. FIG. 6b illustrates aperture array 100 that includes rectangular shaped apertures. The apertures of aperture array 100 image one fourth of rectangular area 80 at a time. FIGS. 6c-6f illustrate four shifted apart images of sub-areas of rectangular area 80 that can be combined to provide an image of rectangular area 80.

Figure 7A:
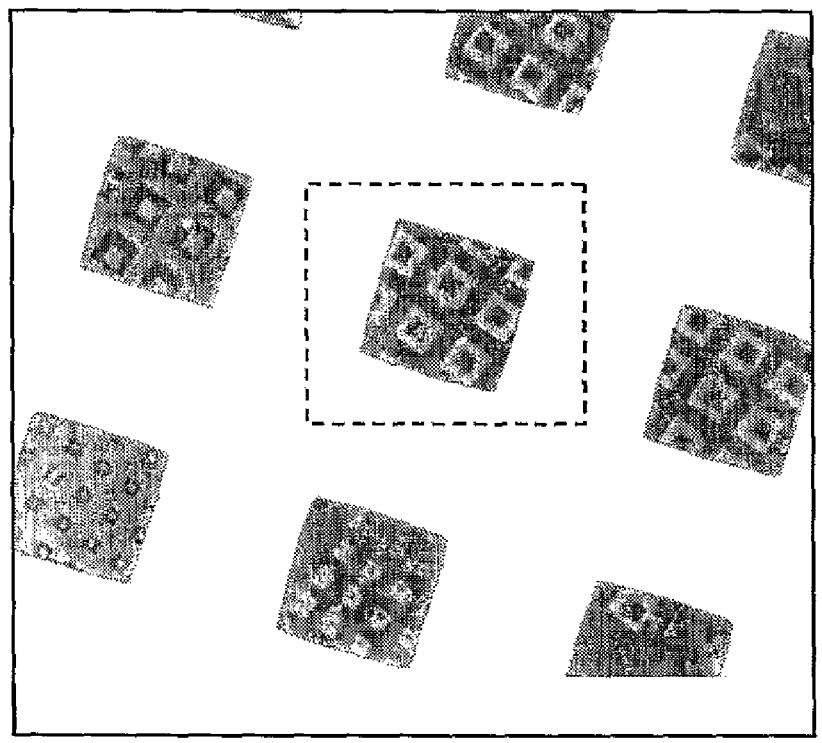
FIGS. 7a and 7b are images of multiple sub-areas of an object and an image of a single sub-area obtained via an aperture array according to an embodiment of the invention.
Figure 7B:
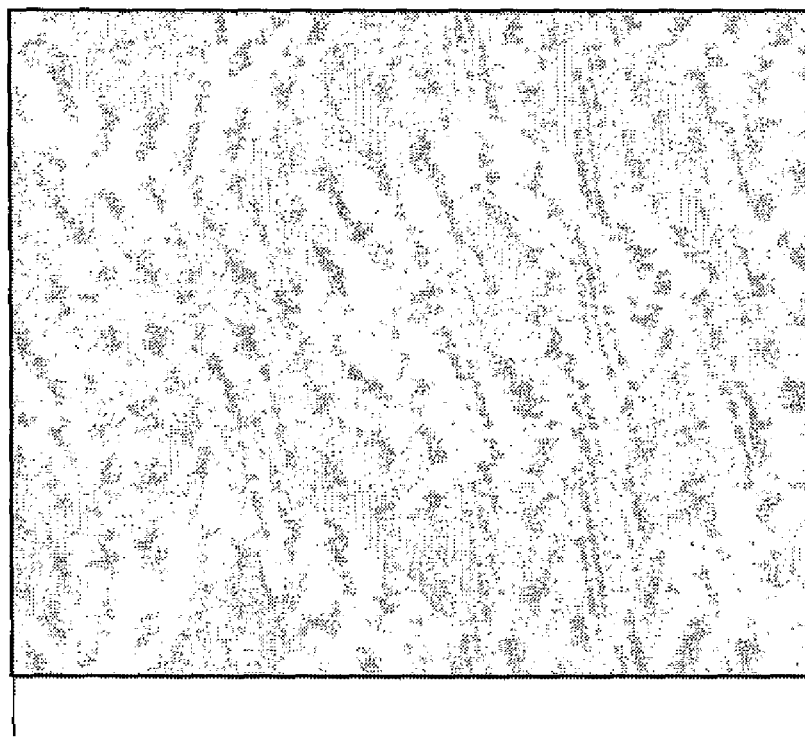

FIG. 7a includes images of multiple sub-areas 68(1)-68(9) of an object obtained through nine apertures. FIG. 7b is a magnified image of sub-area 68(5) of the object.

An aperture array can be manufactured in various manners including deposition and etch back. The deposition includes depositing one or more ultra thin membrane on an aperture array. The etch back includes etching a plate in order to form multiple apertures.

It is noted that different aperture arrays or different aperture arrays can be used in an interchangeable manner. Interface 3 can include multiple aperture arrays and at a given point of time one (or more) aperture array can be illuminated by one or more electron beams.

FIG. 8 illustrates an interface 3 that includes three steps 111, 113 and 115. Each step can include one or more apertures. The lowest step 111 hosts the smallest apertures and the thinnest membranes 112 to provide the highest resolution. The distance between these apertures and the object is smallest. The highest step 115 hosts the largest apertures and the thickest membranes 116 to provide the largest field of view (but at the lowest resolution). Intermediate step 113 includes membranes 114.

It is noted that FIG. 8 is a cross sectional view of interface 3. Interface 3 can have a annular shape (where steps 113 and 115 are ring shaped) but this is not necessarily so. For example—it can have a rectangular shape.

Scanning Mechanism

An area of an object can be scanned by at least one of the following or a combination of both: (i) electrostatic scanning of the electron beam; (ii) mechanical scanning of the object with the electron beam in spot mode to form an image, which can be useful if one utilizes a very small aperture and wants to generate an image with field of view larger than the size of the aperture; (iii) mechanical scanning of the microscope with the electron beam in spot mode to form an image which can be useful if one utilizes a very small aperture and wants to generate an image with field of view larger than the size of the aperture; (iv) mechanical scanning of the aperture or window simultaneously with electrostatic scanning of the electron beam so that the electron beam follows the window position.

Detection Arrangement

According to various embodiments one or more detectors can be positioned within the vacuum environment and, additionally or alternatively, one or more detector can be positioned in the non-vacuum environment. A combination of both can also be provided thus one or more detector is positioned in the non-vacuum environment while one or more other detectors are positioned in the vacuum environment.

FIGS. 1-3b illustrate detectors that are located in the vacuum environment. A detector can, for example, be positioned inside the vacuum environment, between the object and an aperture or around the aperture. Locating the detectors in the vacuum environment can facilitate small and even very small working distances between the object and one or more apertures, thus contribute to the resolution of the image. Placing detectors in the vacuum environment also enables to use detectors that are less compatible with air such using coatings which easily oxides.

It is noted that using different detectors can provide more information about the illuminated area of the object and that multiple detectors can be activated simultaneously.

According to an embodiment a pair of detectors is used for detecting electrons. The pair includes a backscattered electron (BSE) detector and a secondary electron (SE) detector. The BSE detector can be located between the membrane and an objective lens. The BSE detector can have an annular shape that defines an opening enabling the primary beam to pass.

The BSE detector can also be segmented to enhance topography information. The SE detector can be an Everhart-Thornley detector (ETD) placed to the side of the primary electron beam. Secondary electrons are attracted to the ETD with a help of a biased collecting grid. The SE detector can have an annular shape that defines an opening enabling the primary beam to pass. The SE detector can also be segmented to enhance topography information.

According to another embodiment a pair of detectors is used for detecting electrons. The pair includes a BSE detector and a light detector. Both detectors operate simultaneously.

A parabolic mirror located between the membrane and the objective, having an opening enabling the primary electron beam to pass will collect to light to a photomultiplier placed in the side of the electron path. The mirror can be coated with a high secondary electron emitter such as CsI. In this arrangement, backscattered electrons impinging the coated mirror will generate secondary electrons which will be collected by a SE detector X-ray detector can be useful for material analysis. Integrating such analysis to an imaging engine permits localization of the object to be analyzed enabling higher sensitivity for smaller object as opposed to macroscopic analysis. Another possibility is to use emitted X-rays for image generation which is commonly referred as X-ray mapping.

For analysis with low resolution where working distance of >100 microns can be applied, the X-ray detector can be located outside the vacuum environment. It would be preferable to use an annular detector to increase the collection efficiency.

For analysis with high resolution, where smaller working distance has to be applied, let say <100 microns, the detector will be situated inside the vacuum. If a side detector is used it can be in a configuration where backscattered electrons, secondary electrons and light can be detected. An alternative arrangement where emphasis is on high X-ray collection efficiency is to use an annular X-ray detector such as a multi cell Silicon drift detector (SDD) manufactured by PNSensor.

Vacuum

SEM column 1 operates under vacuum. SEM column 1 can include multiple differentially pumped spaces that are separated by a non-sealed aperture. It is noted that the sealing provided by interface 3 can render such a partition unnecessary. It is noted that the vacuum can be provided by one or more pump such as an ion pump, a turbo pump and the like. Since the system is isolated a microscope can be designed without a pump as done in a CRT.

Working Distance

There are three major effects associated with working distance: resolution, signal to noise and detection. For a given membrane and primary beam energy, the resolution will decrease linearly with working distance due to the beam divergence introduced from scattering inside the membrane. The second effect has to do with scattering of the beam in the non-vacuum atmosphere, determined form the electron free mean path. The effect of electron scattering by the gas molecules is to deflect part of the beam out of the original beam. The deflected part, often referred as the "skirt", forms a constant background signal. The central peak retains the beam spot with reduced amplitude. The third effect is also associated with scattering but with the electrons emitted from the specimen.

The scattering is a function of pressure, the gas molecules, electron energy and the working distance. Ideally, it is desired to work in the regime below the electron mean free path, the average distance an electron travels between collisions. For beam energies of few tens of keV, this distance is few tens of microns for molecules of air. The mean free path is dramatically increased for molecules of He. For low energy electrons, the mean free path is few microns. This will be manifested in the detected signal: the signal of the high energy electrons often referred as backscattered electrons will not be attenuated as opposed to the secondary electrons which will suffer multi scattering events and the signal will dramatically reduced.

For a given beam energy, the resolution can be increased by using a thinner membrane and a shorter working distance.

STEM Mode

In this imaging mode, one detects the transmitted electrons through a thin specimen. An electron detector is placed directly below the specimen. In this case, maximal resolution is desired which can be achieved by using high beam energy and the controlling the working distance to be minimal by using an integrated spacer located around the aperture with height determining the working distance. Another advantage of using this spacer which is in contact with the sample is increasing the resonance frequency of the system and therefore making it more immune to external noises.

The electrical current passing through the object as a result of an interaction with the one or more electrical beam can be measured for example by a Pico ampere meter.

The Non-Vacuum Environment

The environment between the sample and the column can be of any composition. In particular, in can be filled with air, at least partially filled with nitrogen or dry nitrogen where the efficiency of light emission due to secondary gas excitation is high because the oxygen which is a quencher of this process is absent. The non-vacuum environment can be at least partially filled with inert gases and in particular He or mixture of He where the mean free path of the electron is higher improving the signal to noise at larger worker distances.

Alignment of the Electron Beam

System 30 should align one or more electron beam to one or more apertures through which the one or more electron beams should pass. The alignment can utilize at least one of the following: (1) alignment coils ensuring that the one or more electron beams are aligned with the one or more apertures; (ii) mechanical movement of the aperture array (or at least the one or more relevant apertures); and (iii) mechanical movement of the objective or a permanent magnet relative to the aperture array. The advantage is that the moving part is not part of the vacuum sealing.

The mechanical movement of the aperture array (or relevant apertures) can be achieved by using a flexible connector between the aperture array and another part of the interface. The flexible connector can be moved by a motor (piezo motor, lineal motor and the like).

Figure 9A:
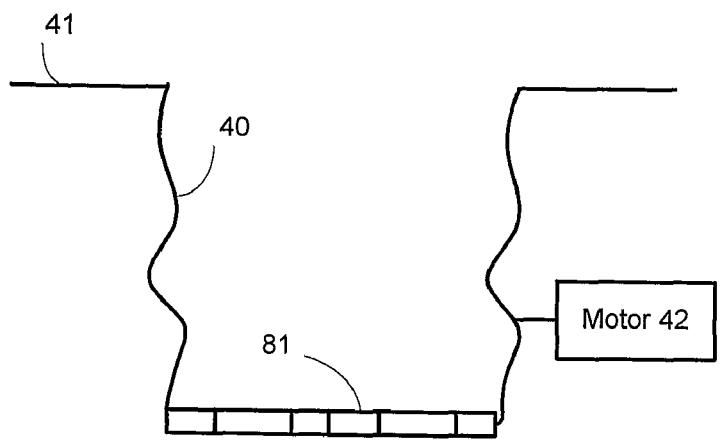
FIGS. 9a-9c illustrates an aperture array, flexible connector and motor, according to various embodiments of the invention.

FIG. 9*a* is a side view of an aperture array 81 that is connected via flexible connector 40 to a rigid portion 41 of interface 3. The flexible connector 40 is moved by motor 42. It is noted that the motor can, additionally or alternatively, move aperture array 81.

Figure 9B:
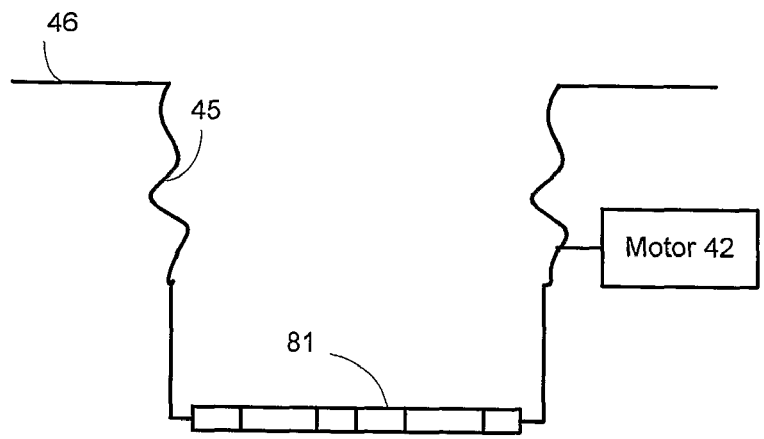

According to an embodiment of the invention the motor is placed at a higher position in order to provide smaller working distances. FIG. 9*b* illustrates a motor 42 that is connected to a rigid portion 44 of interface 3. The rigid portion 44 is connected to another portion 46 of interface 3 via flexible connector 45.

In the first configuration, the mass to be displaced is smaller but incorporating an actuator to move flexible connector 40 sets a mechanical constraint on the working distance between the object and the pole piece. In the second configuration, a larger mass is displaced but the working distance between the object and pole piece can be decreased.

Either one of the alignment methods mentioned above can be used also to select one or more apertures of an aperture array.

In case of mechanical alignment of the aperture, the movement can be motorized, controlled by a controller and positions can be calibrated or preset to allow seamless work.

Figure 9C:
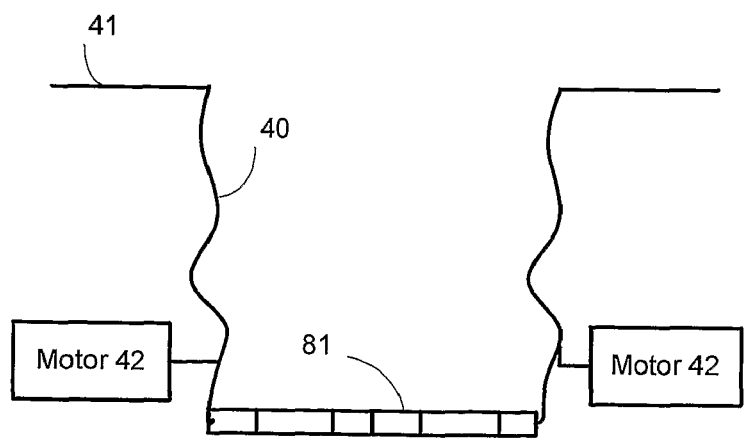

The flexible connector can be also used to control the distance between the object and the aperture by moving the window in the direction perpendicular to the sample plane. This has the advantage of maintaining a fixed distance between the object and the aperture while moving a small mass. FIG. 9c illustrates two motors located at two opposite sides of flexible connector 40. These motors 42 are connected to two opposing sides of flexible connector in a manner that allows them to introduce a vertical movement.

The object can also contact the membrane, for example in the case where it is a liquid or an emulsion. In this case, resolution will be maximal since the electron scattering in the membrane are not reflected in spot broadening.

Sample-Window Distance Measurement

The object aperture distance can be measured by at least one of the following techniques: (i) Illuminating the object, measuring detection signal amplitude and comparing it to a calibration curve. Conveniently, the calibration curve is responsive to mean free path of electrons in non-vacuumed environment. If the distance between the object and the aperture is decreased then detection signals should increase at a certain rate until reaching the mean free path distance from which the increment rate dramatically decreases. (ii) Measuring the counts of emitted X-ray photons of the gas situated between the object and the aperture. The number of counts depends on the beam current and the interaction volume. The interaction volume depends on that distance. (iii) Using a non electron beam related technique such as an integrated distance measuring device based for example on capacitance measurement, triangulation and other common techniques used for example in optical microscopy.

Various Configurations

FIGS. 1-3b illustrate a stand alone system. It is noted that other configuration are available. For example, system 30 can be integrated with another tool or system, one or more detectors can be located in the non-vacuum environment.

According to another embodiment of the invention system 30 can be integrated with another tool.

Figure 10:
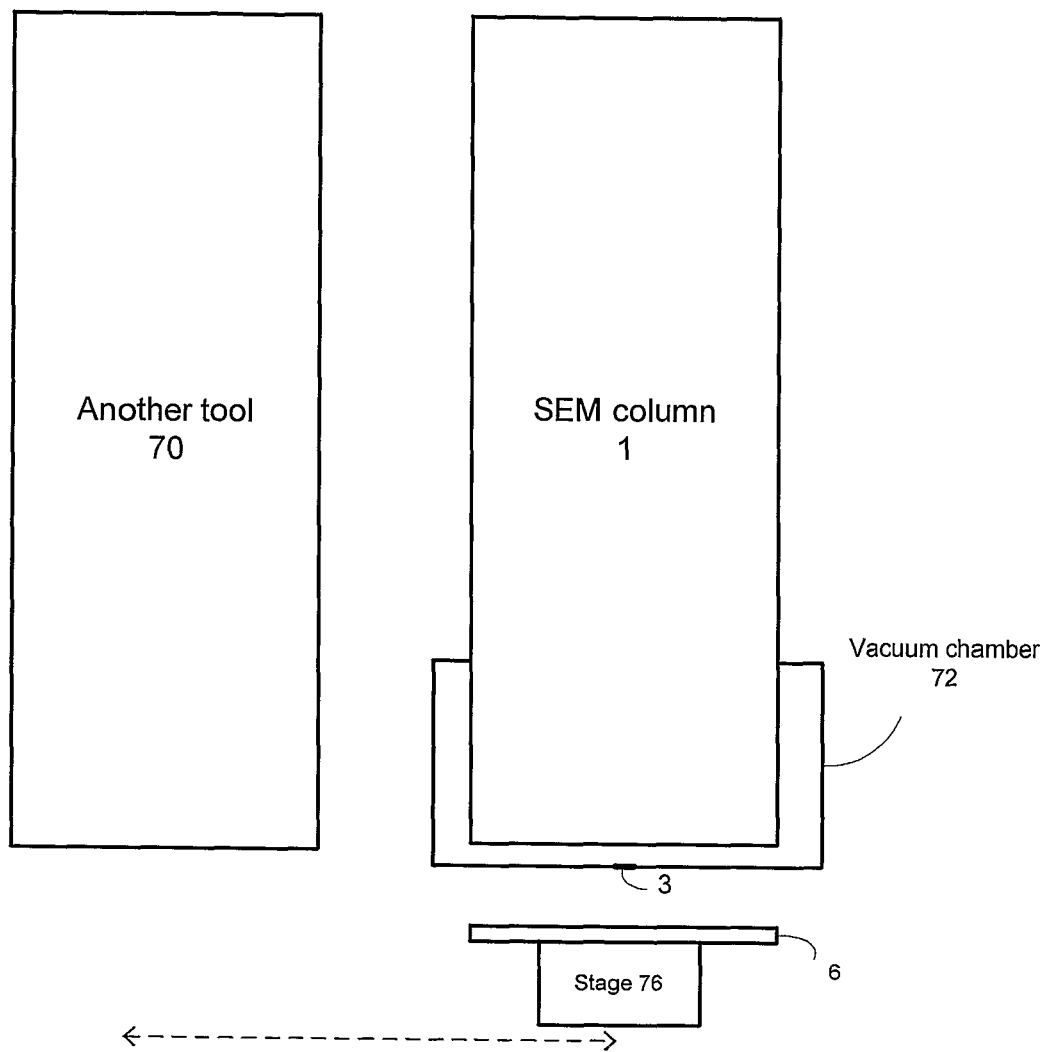
FIG. 10 illustrates a system integrated with another tool according to an embodiment of the invention.

FIG. 10 illustrates SEM column 1, other tool (such as an optical microscope) 70 that are integrated together to provide system 73. SEM column 1 includes interface 3 that is a part of vacuum chamber 72. The other tool does not operate in vacuum thus does not require such a chamber. Object 6 is supported by stage 76 that can move object 6 so that is can be viewed by other tool 70 or by SEM column 1. Additionally or alternatively, system 30 and another tool are used in order to observe an object. The other tool can be of lower or higher resolution. Lower resolution tools can be optical microscopes. The optical microscope can be used for locating regions of interest. The other tool and the scanning electron microscope column can be characterized by different line of sights. The other tool can view a certain area of an object and then sends information that enables the scanning microscope to view that area. Methods for locating targets in a multiple column configurations are known in the art and can be utilized for this purpose. For example, the SEM G3 FIB of Applied Materials Inc. includes a SEM column and a Focused Ion Beam (FIB) column that are parallel to each other. The FIB column and the SEM column are spaced apart from each other but share information that enables these columns to view (at different point in time) the same area.

It is further noted that the SEM column and the other tool can be oriented in relation to each other. Some dual column tools of FEI use such a tilted configuration.

According to various embodiments of the invention the other tool can be an optical tool operating in non-vacuum. In this case the SEM can be used to aid parameters tuning during recipe optimization, and to review results for defect classification. Yet for another example, the SEM can be used to characterize the elemental composition using X-ray spectroscopy of a defect found by the inspection tool.

According to various embodiments of the invention the SEM is part of a tool that can include at least one of the following: (i) an atomic force microscope, (ii) an optical review tool.

The SEM can be used for various purposes, including but not limited to: (i) image voltage contrast in air; (ii) electron beam lithography on photo resist in air; (iii) high resolution imaging of wafers and processes which are incompatible with vacuum such as a photo resist before curing; (iv) image and analyze wafers and processes which are impacted by the vacuum environment, or wafers and processes which are sensitive to formation of adhesion of a monolayer of contamination molecules; (v) excite X-ray emission for material analysis, whereas an image can be used to find a known location and generate an analysis on an exact location; (vi) excite X-ray emission for thickness measurement, whereas an image can be used to find a known location and generate an analysis on an exact location; (vii) excite X-ray mission for density measurement, whereas an image can be used to find a known location and generate an analysis on an exact location; (viii) image and analyze side walls, whereas an image can be used to find a known location and generate an analysis on an exact location, (ix) image and measure thickness of side walls, whereas an image can be used to find a known location and generate an analysis on an exact location, and the like.

According to an embodiment of the invention the SEM can integrated in a process tool such as chemical vapor deposition (CVD), chemical mechanical polisher (CMP), electrochemical deposition (ECP), an etcher and used to control process thickness.

Figure 11:
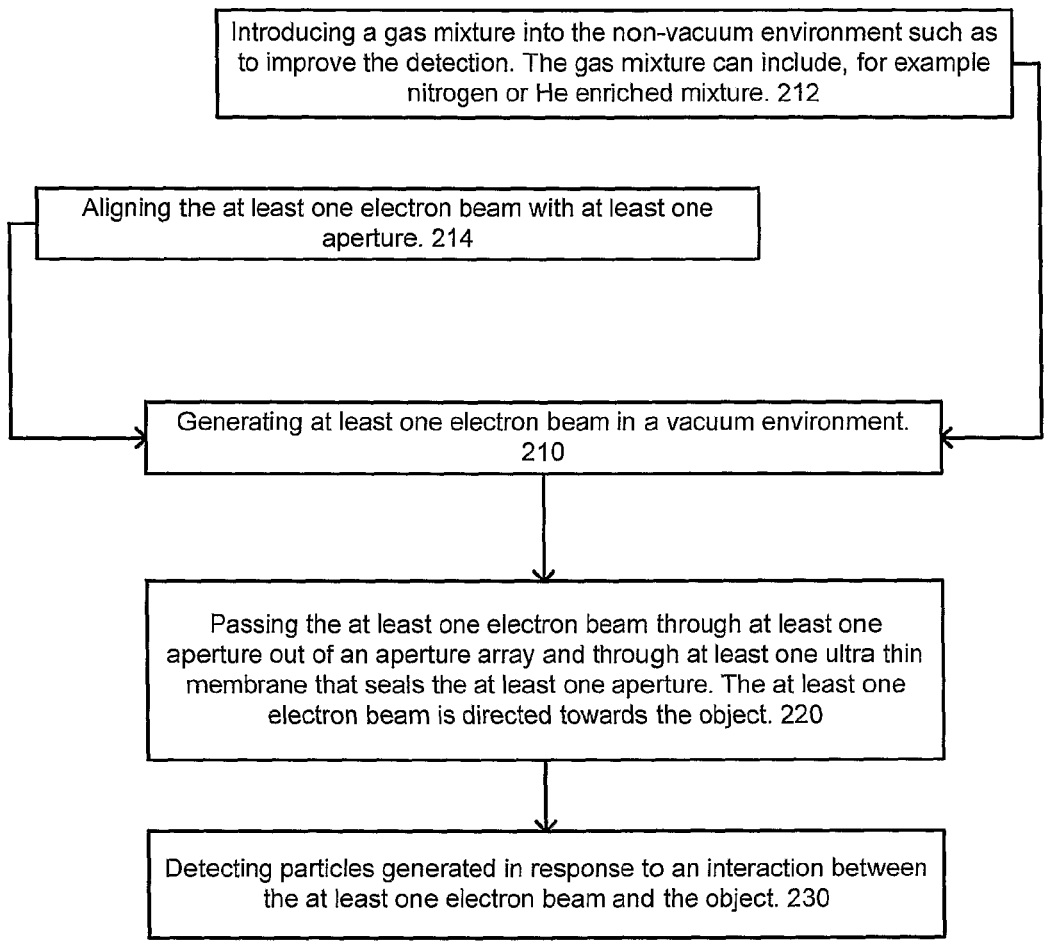
FIGS. 11-14 are flow charts of methods according to various embodiments of the invention.

FIG. 11 illustrates method 200 for observing an object that is positioned in a non-vacuum environment, according to an embodiment of the invention.

Method 200 starts by stage 210 and optionally one or more of stages 212 and 214.

Stage 212 includes introducing a gas mixture into the non-vacuum environment such as to improve the detection. The gas mixture can include, for example nitrogen or He enriched mixture.

Stage 214 includes aligning the at least one electron beam with at least one aperture. Stage 214 can include aligning the at least one electron beam with at least one aperture by mechanically moving the at least one aperture. Additionally or alternatively, stage 214 includes deflecting the at least one electron beam in multiple directions and counting the intensity of detection signals in order to determine when the at least one electron beam are aligned.

Stage 210 includes generating at least one electron beam in a vacuum environment.

Stage 210 is followed by stage 220 of passing the at least one electron beam through at least one aperture out of an aperture array and through at least one ultra thin membrane that seals the at least one aperture. The at least one electron beam is directed towards the object. It is noted that the optical axis of the at least one electron beam can be perpendicular (non-tilted configuration) or non-perpendicular (tilted configuration) to the object.

Stage 220 is followed by stage 230 of detecting particles generated in response to an interaction between the at least one electron beam and the object.

Stage 230 can include at least one of the following stages or a combination thereof: (i) detecting electrons generated in response to the interaction between the at least one electron beam and the object; (ii) detecting photons generated in response to the interaction between the at least one electron beam and the object; (iii) detecting X-ray emission generated in response to the interaction between the at least one electron beam and the object; (iv) detecting particles by a detector positioned within the vacuum environment; (v) detecting particles by a detector positioned within the non-vacuum environment; (vi) detecting electron current generated as a result of the interaction; and (vii) detecting Cathodoluminescence of the object, fluorescence markers or light emitted due to electron excitation of gas molecules.

According to various embodiments of the invention stage 220 can include at least one of the following stages or a combination thereof: (i) passing at least one electron beam through multiple apertures of the aperture array; (ii) passing an electron beam through the selected aperture; (iii) passing at least one electron beam through at least one aperture of the aperture array wherein apertures of the aperture array are positioned at a single horizontal plain; (iv) passing at least one electron beam through at least one aperture of the aperture array; wherein at least one aperture of the aperture array is positioned at a different height than at least one other aperture of the aperture array; (v) passing at least one electron beam through at least one membrane; wherein a certain membrane enables an acquisition of a higher resolution image than another membrane; (vi) performing a first iteration of passing and detecting and a second iteration of passing and detecting; wherein the first phase comprises passing at least one electron beam through at least one membrane to provide a first resolution image of at least a portion of the object, and the second phase comprises passing at least one electron beam through at least one other membrane to provide a second resolution image of at least a portion of the object; and (vii) passing multiple electron beams through multiple apertures of the aperture array.

Figure 12:
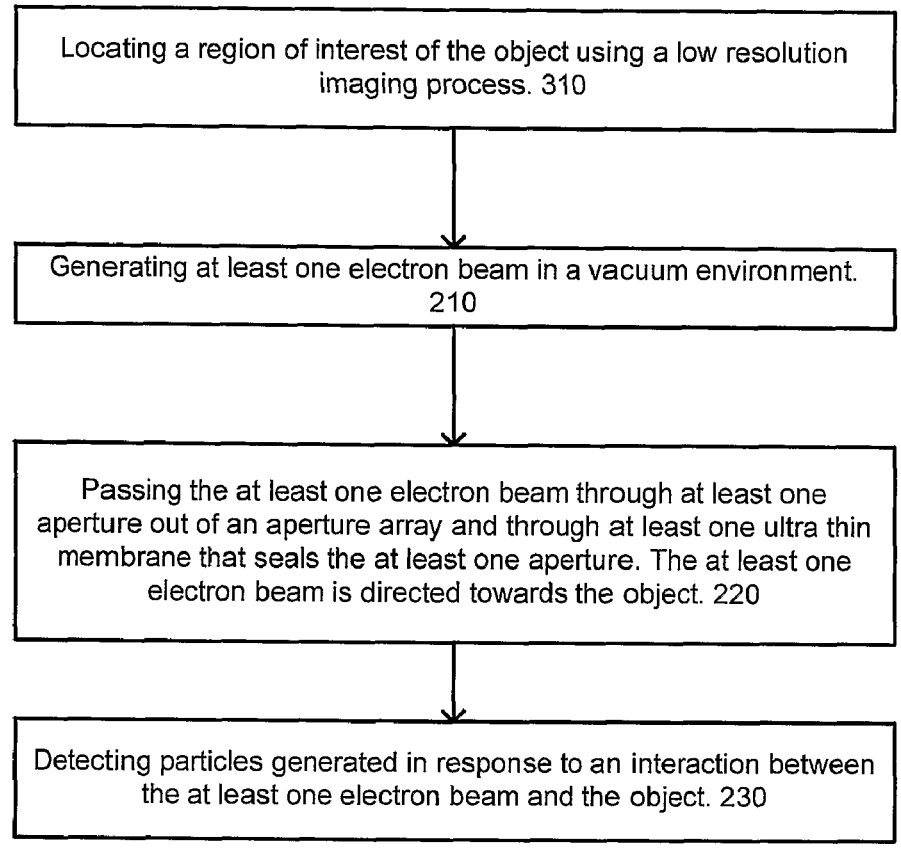

FIG. 12 illustrates method 300 for observing an object that is positioned in a non-vacuum environment, according to another embodiment of the invention.

Method 300 starts by stage 310 of locating a region of interest of the object using a low resolution imaging process.

Stage 310 is followed by stages 210-230. It is noted that at least one of optional stages 212 and 214 can also be included in method 300.

Figure 13:
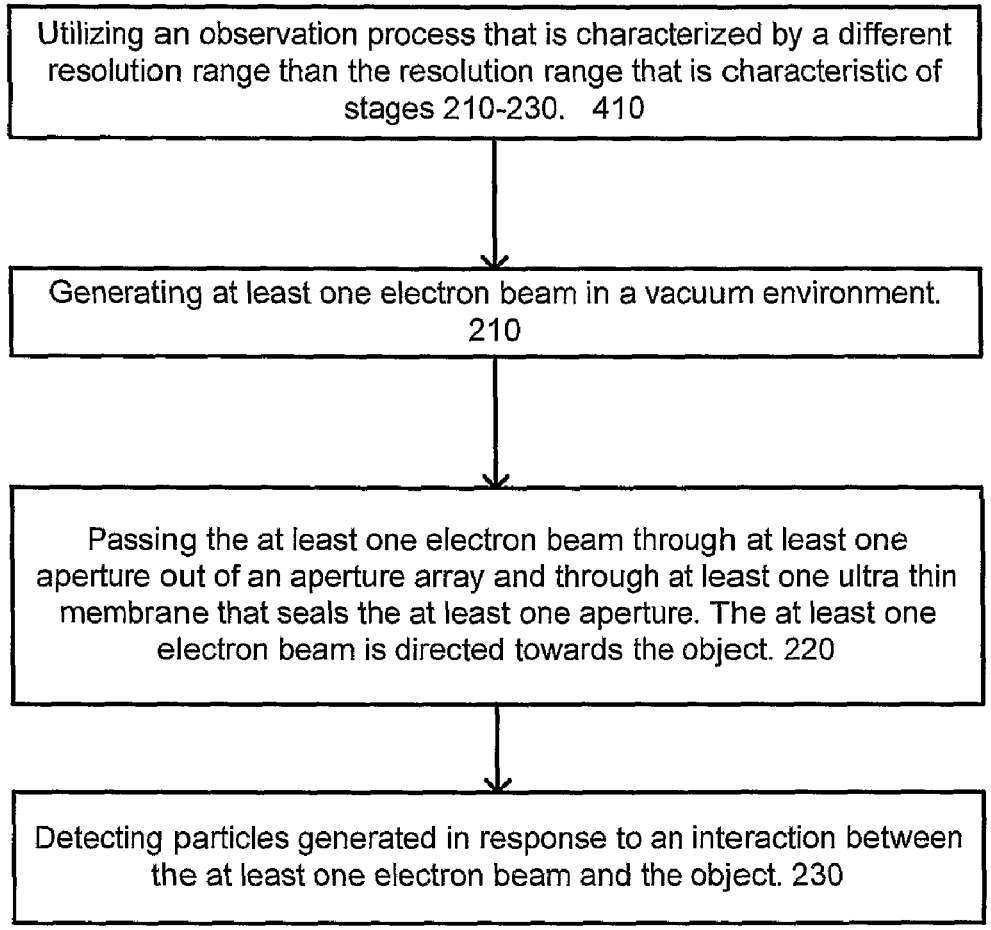

FIG. 13 illustrates method 400 for observing an object that is positioned in a non-vacuum environment, according to another embodiment of the invention.

Method 400 starts by stage 410 of utilizing an observation process that is characterized by a different resolution range than the resolution range that is characteristic of stages 210-230.

Stage 410 is followed by stages 210-230. It is noted that at least one of optional stages 212 and 214 can also be included in method 400.

It is noted that stages 210-230 can be followed by stage 410.

Conveniently, stage 410 includes at least one of the following or a combination thereof: (i) atomic force microscopy; (ii) optical inspection process.

Figure 14:
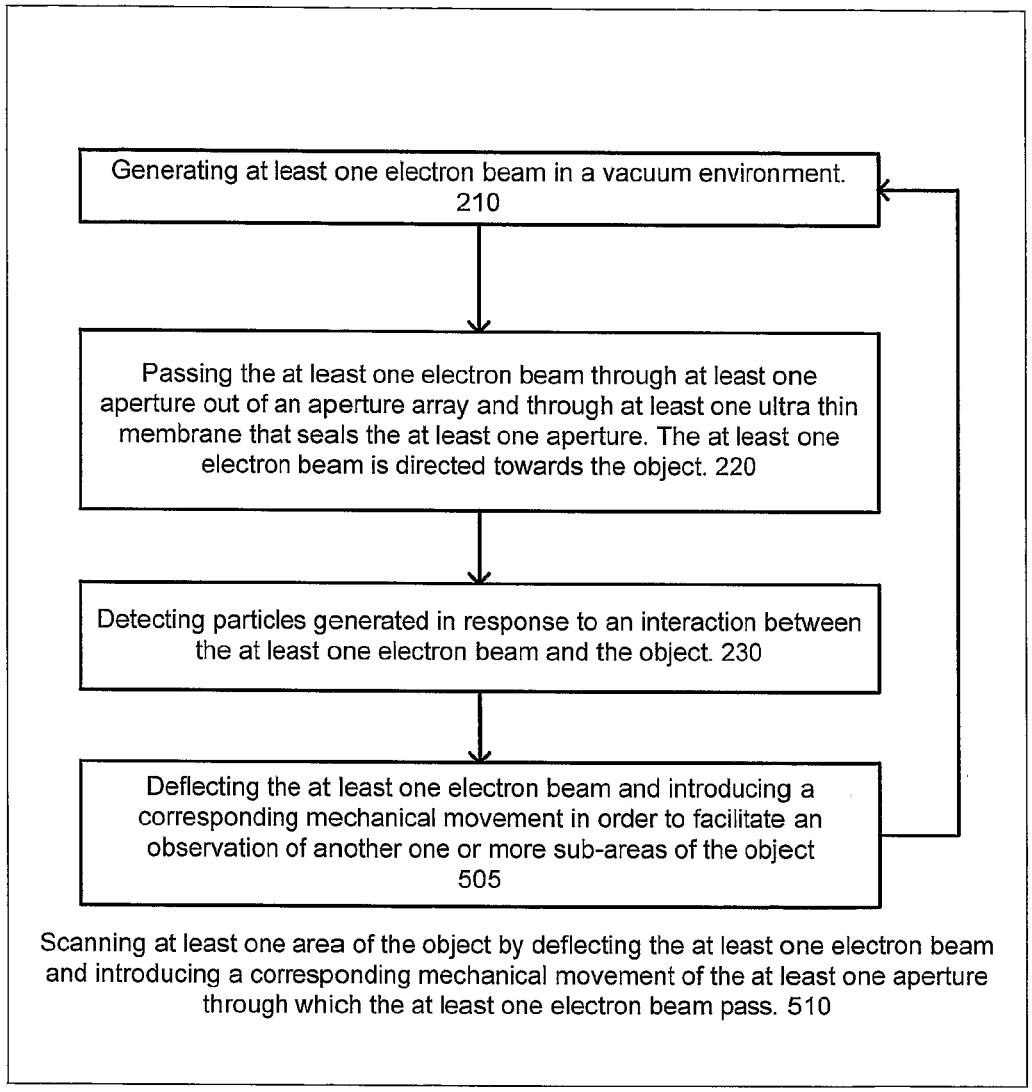

FIG. 14 illustrates method 500 for observing an object that is positioned in a non-vacuum environment, according to another embodiment of the invention.

Method 500 starts by stage 510 of scanning at least one area of the object by deflecting the at least one electron beam and introducing a corresponding mechanical movement of the at least one aperture through which the at least one electron beam pass.

Figure 15A:
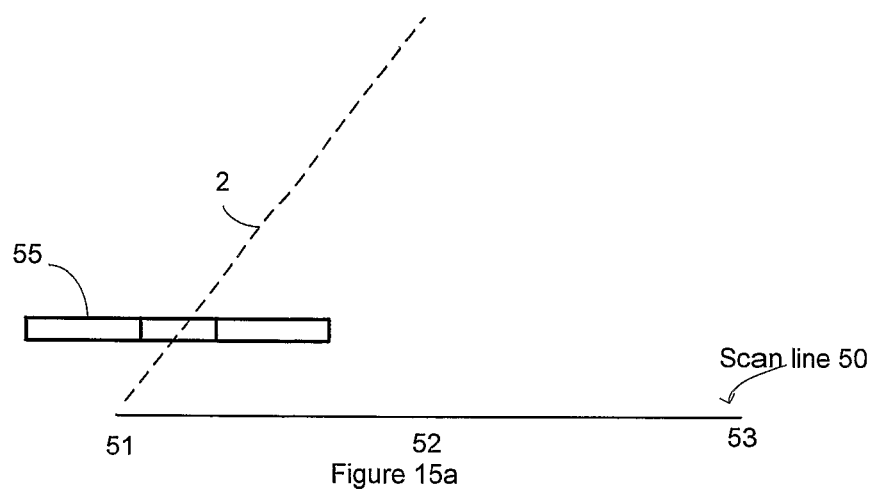
FIGS. 15a-15c illustrate multiple positions of an aperture and multiple electrical beam orientations during a scan according to an embodiment of the invention.
Figure 15B:
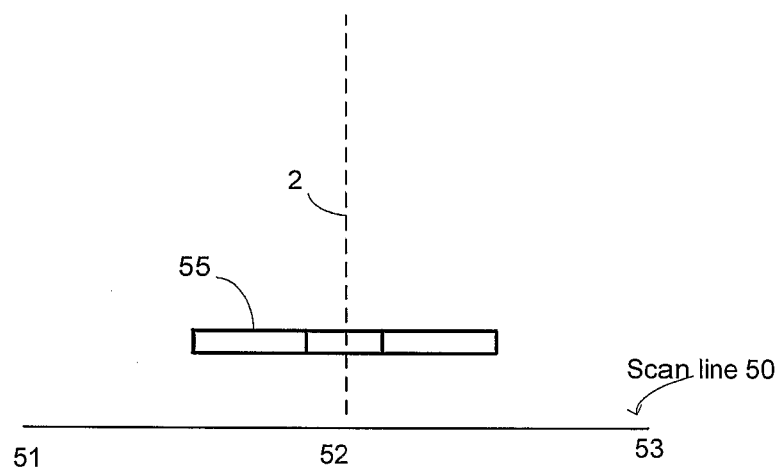
Figure 15C:
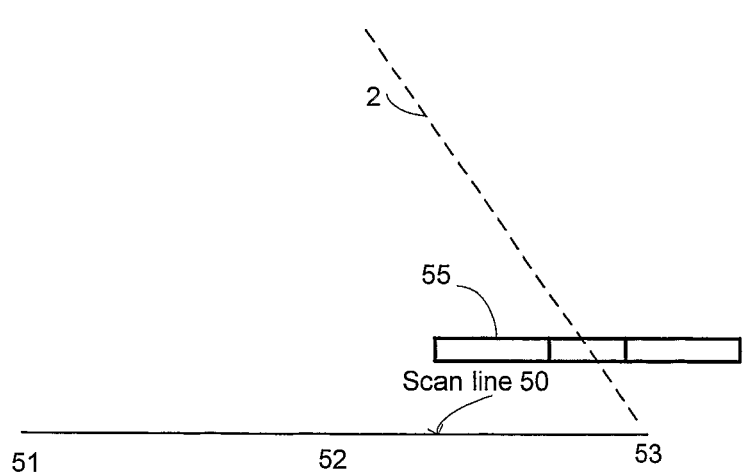
Figure 16A:
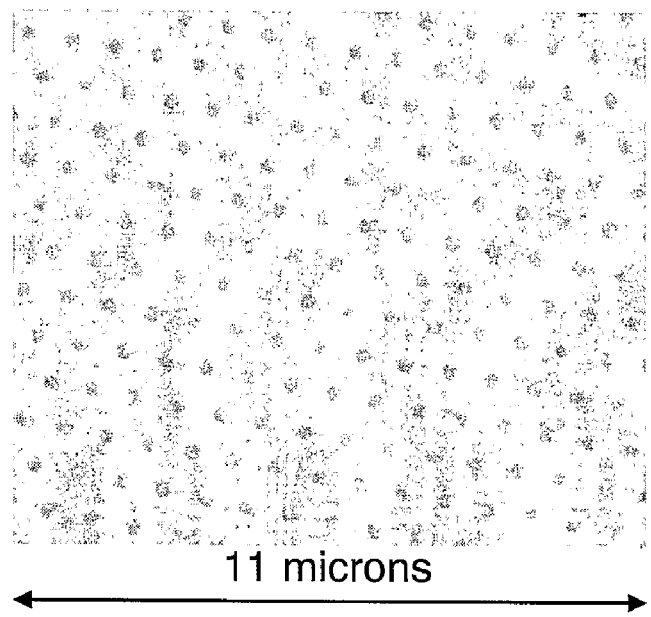
FIGS. 16a-16b are images of wafer with contacts imaged in air.
Figure 16B:
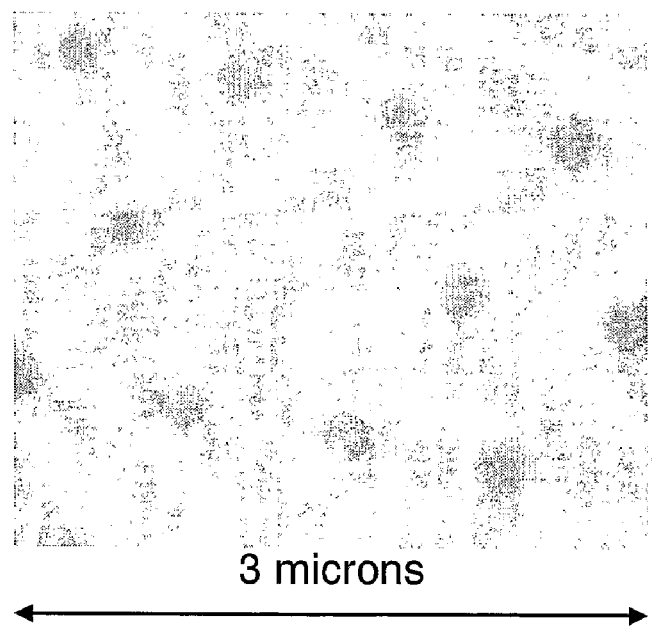
Figure 17:
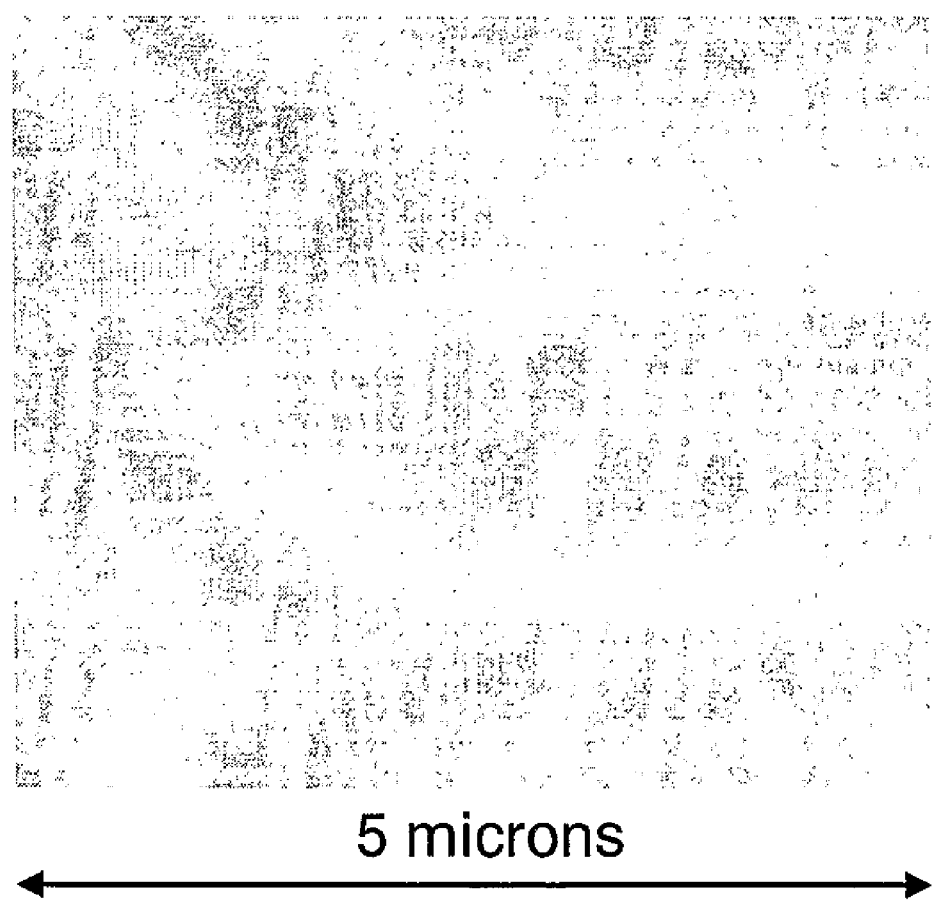
FIG. 17 is an image of a Cu test structure imaged in air.

FIGS. 15a-15c illustrate multiple positions of an aperture and multiple electrical beam orientations during a scan according to an embodiment of the invention. It is assumed that the object is scanned by a scan line 50. Scan line 50 is delimited by right end 51 and left end 53. The center of scan line 50 is denoted 52. FIG. 15a illustrates a point in time during which electron beam 2 is deflected towards right end 51 and aperture 55 is moved to a certain right position in order to enable electron beam 2 to pass through it. FIG. 15b illustrates a point in time during which electron beam 2 is deflected towards center 52 and aperture 55 is moved to a certain center position in order to enable electron beam 2 to pass through it. FIG. 15c illustrates a point in time during which electron beam 2 is deflected towards left end 53 and aperture 55 is moved to a certain left position in order to enable electron beam 2 to pass through it.

Stage 510, includes repetitively executing stages 210-230 in order to observe at least one sub-area of the object, executing stage 505 of deflecting the at least one electron beam and introducing a corresponding mechanical movement in order to facilitate an observation of another one or more sub-areas of the object and either repeating stages 210-230 or ending stage 510.

It is noted that at least one of optional stages 212 and 214 can also be included in method 500.

Conveniently, stage 510 includes at least one of the following or a combination thereof: (i) scanning at least one area of the object by deflecting the at least one electron beam and introducing a corresponding mechanical movement of the aperture array; (ii) scanning at least one area of the object by deflecting the at least one electron beam and introducing a corresponding mechanical movement of the aperture array; wherein a component that includes the aperture array is flexibly connected to another component of an interface that separates the vacuum environment from the non-vacuum environment; (iii) scanning multiple areas of the object by deflecting the at least one electron beam that pass through multiple apertures of the aperture array; (iv) scanning multiple areas of the object by deflecting the at least one electron beam that pass through multiple apertures of the aperture array and introducing a corresponding mechanical movement of the aperture array; (v) scanning an area of the object by deflecting the at least one electron beam by a deflector positioned within the vacuum environment.

APPENDIX A

Transmission of Electrons Through a Membrane of Carbon

The interface between the vacuum where the electrons are traveling in the column and the sample which is in non-vacuum is an ultra thin membrane. The membrane has to fulfill the following criteria: (i) Mechanical strength: To withstand the pressure difference between vacuum and the non-vacuum atmosphere. The mechanical strength depends on the area of the membrane, its thickness and its Young's modulus. For a given material, there is a tradeoff between the membrane thickness and its area. The maximal radial stress $\sigma$, for a circular window of radius r and thickness t, separating a pressure differential p, is proportional to $\sigma \sim p\ r^2/t^2$.

For a given yield stress $\sigma_{yield}$ and difference, the minimum membrane thickness $t_{min}$ depends on the radius of the foil: $t_{min} \sim (pr^2/\sigma_{yield})^{1/2}$ (ii) Electron optics: the membrane should have minimal influence on the primary beam to achieve maximal resolution. There are two factors affecting the spot size: (ii.a) Scattering of the electrons due to the interaction with the membrane. The scattering depends on the primary beam energy, the membrane thickness and density. Optimally one would use the thinnest available membrane made from a low density material. This scattering induces broadening of the original spot size or a scattering angle. Thus, for a given membrane and accelerating voltage the spot diameter on the sample plane increases linearly with the working distance between the membrane and the specimen. (ii.b) Scattering of the electrons due to the interaction with the non-vacuum atmosphere. This scattering and the issue of working under small working distance will be addressed later in this document. (iii) Signal to noise ratio: to allow maximal primary electrons to reach the sample and maximal electrons and photons emitted from the sample to reach the detectors.

The transmission of electrons through a membrane of Carbon (density=2.25 g/cm$^3$) calculated for different energies and thicknesses using H.-J. Fitting empirical formula (Journal of Electron Spectroscopy and Related Phenomena 136 (2004) 265-272) and the transmission of X-ray photons of some elements, calculated based on attenuation coefficient taken from NIST database, are shown in Table 1.

According to Fitting, in the energy region below $E_0=10$ keV the range-energy relation: $R = 900\rho^{-0.8}E_0^{1.3}$ was found with R in Å, $\rho$ in g/cm$^3$, and $E_0$ in keV.

Assuming absorbance/scattering is a serial in nature, one can deduce the transmission for r: $T(r)=0.01^{r/R}$.

The photon transmission is calculated according to $I=I_0 exp^{-\mu(\lambda)d}$; where $I_0$ is the number of photons reaching the membrane, I is the number of photons transmitted, d is the membrane thickness. The quantity $\mu(\lambda)$ with measuring unit cm$^{-1}$ is called the linear attenuation coefficient and is dependent upon the wavelength $\lambda$ of the primary radiation and the density of the layer.

For lower energies, the membrane thickness has a big impact on the transmission. For X ray photons the membrane is highly transmissible. This is the case also for visible light.

As the guideline for the design of the microscope is resolution, the immediate conclusion is that one has to use the thinnest membrane possible. This fortunately also favors optimized detection. However from the mechanical compatibility it implies that the membrane size is limited. The question is therefore how one can have an ultra thin membrane with thickness of few nanometers or few tens of nanometers. Such membrane can stand the pressure difference if its area is small. One can see from Equation 2 that for a given material and pressure difference, the decreasing the thickness scales linearly with decreasing the window size. So the key to have high resolution electron beam traveling in non-vacuum is to use a small area ultra thin membrane. For example, in images 6 and 17, a 30 nm SiN window with dimensions of 50×50 micron$^2$ was used. Technically, there are several ways of limiting the area of a membrane. An ultra thin membrane on a support can be generally realized by two different approaches.

The first approach is the deposition method. An ultra thin layer is deposited or brought to a support structure. The simplest support structure is an aperture which determines the size of the available membrane. This approach is used in TEM grid preparation where Carbon layers of thickness <10 nm are routinely placed on grids.

The second approach is the etch-back method. One deposit an ultra thin layer A on a substrate B and then etches back B in a defined region to form an ultra thin window A on B. This is the case for example of SiN or SiO$_2$ on Si. Both A and B can also be thinned by ion milling. This is seen in image 4 where an opening in the Si with a shape of a pyramid, which has been etched back to form a SiN window. A Cu grid, situated 15 microns below the window in air, is clearly seen.

The size of the membrane or window determines the available field of view of the microscope. When working with a high resolution microscope, the common practice is first to use small magnification (large field of view) to locate the area or feature of interest, to bring the feature to the center of the

TABLE 1 transmission of electrons and photons of different energies through membranes of Carbon of different thicknesses

| | Thickness (nm) | | | | | | |
|---|---|---|---|---|---|---|---|
| | 2 | 5 | 10 | 20 | 30 | 50 | 100 |
| Energy (eV) | | | | | | | |
| 100 | 2.0E−02 | 5.7E−05 | 3.3E−09 | 1.1E−17 | 3.6E−26 | 3.9E−43 | 1.5E−85 |
| 300 | 3.9E−01 | 9.6E−02 | 9.3E−03 | 8.6E−05 | 7.9E−07 | 6.8E−11 | 4.6E−21 |
| 600 | 6.8E−01 | 3.9E−01 | 1.5E−01 | 2.2E−02 | 3.3E−03 | 7.4E−05 | 5.5E−09 |
| 800 | 7.7E−01 | 5.2E−01 | 2.7E−01 | 7.3E−02 | 2.0E−02 | 1.4E−03 | 2.1E−06 |
| 1000 | 8.2E−01 | 6.1E−01 | 3.8E−01 | 1.4E−01 | 5.3E−02 | 7.5E−03 | 5.6E−05 |
| 2000 | 9.2E−01 | 8.2E−01 | 6.7E−01 | 4.5E−01 | 3.0E−01 | 1.4E−01 | 1.9E−02 |
| 5000 | 9.8E−01 | 9.4E−01 | 8.9E−01 | 7.9E−01 | 7.0E−01 | 5.5E−01 | 3.0E−01 |
| Peaks | | | | | | | |
| C(281) | 1.00 | 1.00 | 0.99 | 0.99 | 0.98 | 0.98 | 0.95 |
| N(392) | 0.99 | 0.97 | 0.95 | 0.90 | 0.85 | 0.76 | 0.58 |
| O(548) | 1.00 | 0.99 | 0.98 | 0.95 | 0.93 | 0.89 | 0.79 |
| Cu(934) | 1.00 | 1.00 | 0.99 | 0.99 | 0.98 | 0.97 | 0.95 |
| Si(1703) | 1.00 | 1.00 | 1.00 | 1.00 | 1.00 | 0.99 | 0.99 |

One can draw some general conclusions from the data: for primary electron beam with energy higher than 5000 eV membranes with thickness <100 nm are highly transmissible.

high resolution field of view using for example a moving stage and to change to a smaller field of view for a high resolution image of the feature. In the following a description of how to resolve the apparent conflict between field of view and resolution enabling, the ease of use for locating an object in a big field of view together with the limitation of having a small window yielding high resolution is given.

Figure 18A:
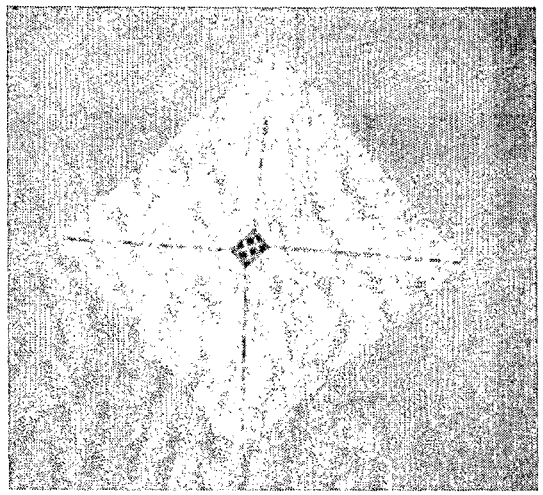
Figure 18A:
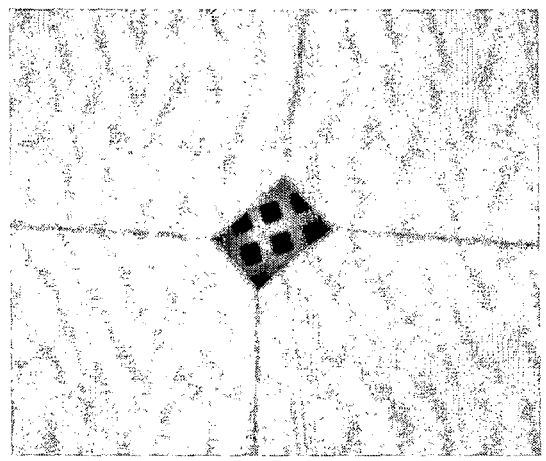
Figure 18C:
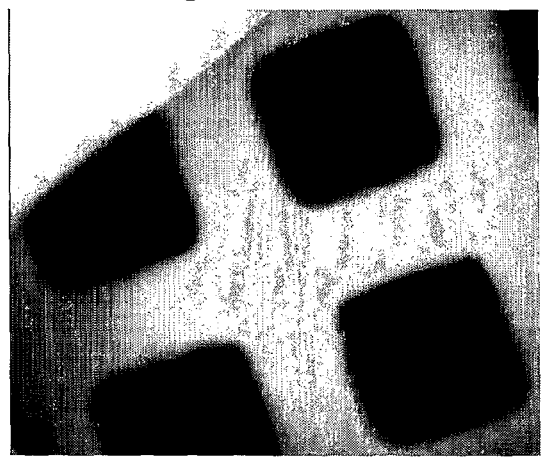

FIGS. 18a-18c are images of a grid obtained through a 10 nm thick carbon membrane. These images also include a pyramid shaped aperture. Images 18a-18c differ from each other by the magnification level. The first image is a small magnification image showing a grid. In this image the area of interest is found. The second image is a higher magnification image of the area of interest.

The present invention can be practiced by employing conventional tools, methodology and components. Accordingly, the details of such tools, component and methodology are not set forth herein in detail. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A method for observing an object that is positioned in a non-vacuum environment, the method comprising:
    directing at least one electron beam that is generated in a vacuum environment through at least one aperture sealed by at least one ultra thin membrane towards said object which is positioned in said non-vacuum environment, said at least one membrane separating said vacuum environment from said non-vacuum environment;
    at least partially filling said non-vacuum environment with Helium whereby the mean free path of electrons therethrough is enhanced; and
    detecting the results of an interaction between the at least one electron beam and the object, wherein the enhanced mean free path of electrons due to the presence of Helium provides enhanced signal to noise ratio for a given separation between said at least one membrane and said object.

2. The method according to claim 1 wherein:
said at least one aperture comprises an aperture array; and
said directing comprises directing said at least one electron beam through multiple apertures of said aperture array.

3. The method according to claim 1 wherein:
said at least one aperture comprises an aperture array;
said method further comprises, prior to said directing, selecting an aperture of said aperture array; and
said directing comprises directing said electron beam through the selected aperture.

4. The method according to claim 1 wherein:
said at least one aperture comprises an aperture array;
apertures of said aperture array are positioned at a single horizontal plane; and
said directing comprises directing said at least one electron beam through at least one aperture of said aperture array.

5. The method according to claim 1 wherein:
said at least one aperture comprises an aperture array;
at least one aperture of the aperture array is positioned at a different height than at least one other aperture of said aperture array; and
said directing comprises directing said at least one electron beam through at least one aperture of said aperture array.

6. The method according to claim 1 wherein:
said at least one aperture comprises an aperture array;
at least one aperture of the aperture array enables an acquisition of a higher resolution image than at least one other aperture of said aperture array; and
said directing comprises directing said at least one electron beam through at least one aperture of said aperture array.

7. The method according to claim 1 wherein:
said at least one aperture comprises an aperture array;
said directing comprises directing said at least one electron beam through at least a first aperture of said aperture array to provide a first resolution image of at least a portion of said object; and
the method also comprises directing said at least one electron beam through at least a second aperture of said aperture array, said second aperture being different from said first aperture, to provide a second resolution image of at least a portion of said object.

8. The method according to claim 1 and further comprising, prior to said directing, locating a region of interest of said object using a low resolution imaging process; and wherein said directing comprises directing said at least one electron beam towards the region of interest.

9. The method according to claim 1 wherein:
said directing and said detecting are characterized by a first resolution range; and
the method further comprises utilizing another observation process according to a different resolution range.

10. The method according to claim 9 wherein said another observation process comprises atomic force microscopy.

11. The method according to claim 9 wherein said another observation process comprises an optical inspection process.

12. The method according to claim 1 further comprising scanning at least one area of the object by deflecting the at least one electron beam and introducing a corresponding mechanical movement of the at least one aperture through which the at least one electron beam is directed.

13. The method according to claim 1 wherein:
said at least one aperture comprises an aperture array; and
the method also comprises:
    scanning at least one area of said object by deflecting the at least one electron beam; and
    introducing a corresponding mechanical movement of said aperture array.

14. The method according to claim 1 wherein:
said at least one aperture comprises an aperture array; and
a component that comprises said aperture array is flexibly coupled to another component of an interface that separates the vacuum environment from the non-vacuum environment; and
the method also comprises scanning at least one area of the object by deflecting the at least one electron beam and introducing a corresponding mechanical movement of said aperture array.

15. The method according to claim 1 wherein:
said at least one aperture comprises an aperture array; and
the method also comprises scanning multiple areas of the object by deflecting the at least one electron beam that is directed through multiple apertures of said aperture array.

16. The method according to claim 1 wherein:
said at least one aperture comprises an aperture array; and
the method also comprises:
    scanning multiple areas of the object by deflecting the at least one electron beam that is directed through multiple apertures of said aperture array and introducing a corresponding mechanical movement of said aperture array.

17. The method according to claim 1 further comprising scanning an area of the object by deflecting the at least one electron beam by a deflector positioned within the vacuum environment.

18. The method according to claim 1 wherein said detecting comprises detecting electrons generated by said interaction.

19. The method according to claim 1 wherein said detecting comprises detecting photons generated by said interaction.

20. The method according to claim 1 wherein said detecting comprises detecting X-ray emissions generated by said interaction.

21. The method according to claim 1 wherein said detecting comprises using a detector positioned within the vacuum environment.

22. The method according to claim 1 wherein said detecting comprises using a detector positioned within the non-vacuum environment.

23. The method according to claim 1 wherein an optical axis of the at least one electron beam is non-perpendicular to the object.

24. The method according to claim 1 wherein said detecting comprises detecting electron current generated by said interaction.

25. The method according to claim 1 wherein said detecting comprises detecting at least one of Cathodoluminescence of the object, fluorescence markers and light emitted due to electron excitation of gas molecules.

26. The method according to claim 1 further comprising aligning the at least one electron beam with the at least one aperture.

27. The method according to claim 1 further comprising aligning the at least one electron beam with the at least one aperture by mechanically moving the at least one aperture.

28. The method according to claim 1 further comprising:
repetitively altering a distance between said at least one aperture and the object and measuring electrons emitted from said object to provide measurements results; and
comparing the measurement results to a calibration curve that is responsive to a mean free path of electrons in the non-vacuum environment.

29. The method according to claim 1 and also comprising determining a distance between said at least one aperture and the object based upon an expected mean free path of electrons in the non-vacuum environment.

30. The method according to claim 1 and also comprising determining a distance between said at least one aperture and said object based upon counts of emitted X-ray photons of gas within the non-vacuum environment.

31. A scanning electron microscope (SEM) interface between a vacuum SEM environment and a non-vacuum sample environment, the interface comprising:
a SEM mountable aperture assembly including at least one aperture sealed by at least one ultra thin membrane that is substantially transparent to electrons and withstands a pressure difference between said SEM vacuum environment and said non-vacuum sample environment; and
a non-vacuum environment Helium filler, associated with said aperture assembly for at least partially filling said non-vacuum environment with Helium whereby the mean free path of electrons therethrough is enhanced.

32. The SEM interface according to claim 31 wherein:
said at least one aperture comprises an aperture array; and
apertures of said aperture array are positioned at a single horizontal plane.

33. The SEM interface according to claim 31 wherein:
said at least one aperture comprises an aperture array; and
at least one aperture of the aperture array is positioned at a different height than at least one other aperture of said aperture array.

34. The SEM interface according to claim 31 wherein:
said at least one aperture comprises an aperture array; and
at least one aperture of said aperture array enables an acquisition of a higher resolution image than at least one other aperture of said aperture array.

35. A scanning electron microscope assembly for observing an object that is positioned in a non-vacuum environment comprising:
a scanning electron beam source assembly, located in a vacuum environment, the electron beam source being adapted to generate at least one electron beam;
an interface between said vacuum environment and said non-vacuum environment in which said object is positioned, said interface comprising:
an aperture assembly mounted onto said scanning electron beam source assembly and including at least one aperture sealed by at least one ultra thin membrane that is substantially transparent to electrons; and
a non-vacuum environment Helium filler for at least partially filling said non-vacuum environment with Helium whereby the mean free path of electrons therethrough is enhanced;
electron optics adapted to direct the at least one electron beam through said at least one aperture and towards said object located in said non-vacuum environment which is at least partially filled with Helium; and
a detector that detects the results of an interaction between the at least one electron beam and the object in said non-vacuum environment which is at least partially filled with Helium.

36. The scanning electron microscope assembly according to claim 35 wherein:
said at least one aperture comprises an aperture array; and
the electron optics directs said at least one electron beam towards multiple apertures of the aperture array.

37. The scanning electron microscope assembly according to claim 35 wherein:
said at least one aperture comprises an aperture array;
said scanning electron microscope assembly is adapted to select an aperture of the aperture array; and
said scanning electron microscope assembly is adapted to direct an electron beam through the selected aperture.

38. The scanning electron microscope assembly according to claim 35 wherein:
said at least one aperture comprises an aperture array; and
apertures of the aperture array are positioned at a single horizontal plain.

39. The scanning electron microscope assembly according to claim 35 wherein:
said at least one aperture comprises an aperture array;
at least one aperture of the aperture array is positioned at a different height than at least one other aperture of the aperture array.

40. The scanning electron microscope assembly according to claim 35 wherein:
said at least one aperture comprises an aperture array;
at least one aperture of the aperture array enables an acquisition of a higher resolution image than at least one other aperture of the aperture array.

41. The scanning electron microscope assembly according to claim 35 wherein:
said at least one aperture comprises an aperture array;
said electron optics are adapted to direct said at least one electron beam through at least a first aperture of said aperture array to provide a first resolution image of at least a portion of the object, and to direct said at least one electron beam through at least a second aperture of said aperture array, different from said first aperture, to provide a second resolution image of at least a portion of the object.

42. The scanning electron microscope assembly according to claim 35 and wherein said scanning electron microscope assembly is adapted to locate a region of interest of the object using a low resolution imaging process and to direct said at least one electron beam towards the region of interest.

43. The scanning electron microscope assembly according to claim 35 further comprising another observation tool that is characterized by a different resolution than the resolution provided by the at least one electron beam.

44. The scanning electron microscope assembly according to claim 43 wherein said another observation tool is an atomic force microscope.

45. The scanning electron microscope assembly according to claim 43 wherein said another observation tool is an optical inspection tool.

46. The scanning electron microscope assembly according to claim 35 wherein said SEM assembly is adapted to scan at least one area of said object by deflecting the at least one electron beam and introducing a corresponding mechanical movement of the at least one aperture through which the at least one electron beam is directed.

47. The scanning electron microscope assembly according to claim 35 wherein:
said at least one aperture comprises an aperture array; and
said SEM assembly is adapted to scan at least one area of said object by deflecting the at least one electron beam and introducing a corresponding mechanical movement of the aperture array.

48. The scanning electron microscope according assembly to claim 35 wherein:
said at least one aperture comprises an aperture array;
said SEM assembly is adapted to scan at least one area of said object by deflecting the at least one electron beam and introducing a corresponding mechanical movement of the aperture array; and
a component that comprises the aperture array is flexibly coupled to another component of said interface.

49. The scanning electron microscope assembly according to claim 35 wherein:
said at least one aperture comprises an aperture array; and
said SEM assembly is adapted to scan multiple areas of the object by deflecting the at least one electron beam such that it is directed through multiple apertures of the aperture array.

50. The scanning electron microscope assembly according to claim 35 wherein:
said at least one aperture comprises an aperture array; and
said SEM assembly is adapted to scan multiple areas of said object by deflecting the at least one electron beam such that it is directed through multiple apertures of the aperture array and introducing a corresponding mechanical movement of the aperture array.

51. The scanning electron microscope assembly according to claim 35 and further comprising a deflector positioned within the vacuum environment that deflects the at least one electron beam to scan an area of the object.

52. The scanning electron microscope assembly according to claim 35 wherein the detector detects electrons generated as a result of said interaction.

53. The scanning electron microscope assembly according to claim 35 wherein the detector detects photons generated as a result of said interaction.

54. The scanning electron microscope assembly according to claim 35 wherein the detector detects X-ray emissions generated as a result of said interaction.

55. The scanning electron microscope assembly according to claim 35 wherein the detector is positioned within the vacuum environment.

56. The scanning electron microscope assembly according to claim 35 wherein the detector is positioned within the non-vacuum environment.

57. The scanning electron microscope assembly according to claim 35 wherein an optical axis of the at least one electron beam is non-perpendicular to the object.

58. The scanning electron microscope assembly according to claim 35 wherein the detector detects an electron current generated as a result of the interaction.

59. The scanning electron microscope assembly according to claim 35 wherein the detector detects at least one of Cathodoluminescence of the object, fluorescence markers and light emitted due to electron excitation of gas molecules.

60. The scanning electron microscope assembly according to claim 35 wherein:
said SEM assembly is adapted to align the at least one electron beam with the at least one aperture.

61. The scanning electron microscope assembly according to claim 35 wherein:
said SEM assembly is adapted to align the at least one electron beam with the at least one aperture by introducing a mechanical movement to the at least one aperture.

62. The scanning electron microscope assembly according to claim 35 wherein:
said SEM assembly is adapted to:
repetitively alter a distance between said at least one aperture and the object,
measure electrons emitted from said object to provide measurements results, and
compare the measurement results to a calibration curve that is responsive to the mean free path of electrons in the non-vacuum environment.

63. The scanning electron microscope assembly according to claim 35 wherein:
said SEM assembly is adapted to determine a distance between said at least one aperture and the object based upon an expected mean free path of electrons in the non-vacuum environment.

64. The scanning electron microscope assembly according to claim 35 wherein:
said SEM assembly is adapted to determine a distance between said at least one aperture and said object based upon counts of emitted X-ray photons of gas within the non-vacuum environment situated between the object and the at least one aperture.

65. The SEM interface according to claim 32 wherein a component that comprises the at least one aperture is flexibly coupled to another component of the interface.

66. The SEM interface according to claim 65 wherein:
the at least one aperture comprises an aperture array; and
apertures of the aperture array are positioned at a single horizontal plain.

67. The SEM interface according to claim 65 wherein:
the at least one aperture comprises an aperture array and
at least one aperture of the aperture array is positioned at a different height than at least one other aperture of the aperture array.

68. The SEM interface according to claim 65 wherein:
the at least one aperture comprises an aperture array; and
at least one aperture of the aperture array enables an acquisition of a higher resolution image than at least one other aperture of the aperture array.

69. The scanning electron microscope assembly according to claim 35 wherein a component that comprises the at least one aperture is flexibly coupled to another component of the interface.

* * * * *